(12) United States Patent
Kawabe et al.

(10) Patent No.: US 6,376,152 B2
(45) Date of Patent: Apr. 23, 2002

(54) POSITIVE PHOTORESIST COMPOSITION

(75) Inventors: Yasumasa Kawabe; Shinichi Kanna; Fumiyuki Nishiyama, all of Shizuoka (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

(21) Appl. No.: 09/775,620

(22) Filed: Feb. 5, 2001

(30) Foreign Application Priority Data

Feb. 3, 2000 (JP) ..................................... P2000-026363
Jun. 29, 2000 (JP) ..................................... P2000-196719

(51) Int. Cl.$^7$ .............................................. G03F 7/004
(52) U.S. Cl. ..................... 430/270.1; 430/905; 430/919
(58) Field of Search ............................ 430/270.1, 905, 430/919

(56) References Cited

U.S. PATENT DOCUMENTS

| | | | | |
|---|---|---|---|---|
| 5,372,914 A | * | 12/1994 | Naito et al. | 430/270.1 |
| 5,994,022 A | * | 11/1999 | Tanabe et al. | 430/170 |
| 6,022,665 A | * | 2/2000 | Watanabe et al. | 430/270.1 |
| 6,165,672 A | * | 12/2000 | Jung et al. | 430/270.1 |
| 6,306,264 B1 | * | 10/2001 | Kwon et al. | 204/157.43 |
| 6,306,553 B1 | * | 10/2001 | Kihara et al. | 430/176 |

* cited by examiner

*Primary Examiner*—John S. Chu
(74) *Attorney, Agent, or Firm*—Sughrue Mion, PLLC

(57) ABSTRACT

A positive photoresist composition comprises (A) a compound which generates an acid upon irradiation with an actinic ray or radiation, (B) a resin which is insoluble or sparingly soluble in alkali but becomes soluble in alkali by the action of an acid, and (C) a nitrogen-containing compound containing at least one partial structure represented by formula (I) shown below in its molecule:

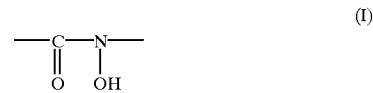

The positive photoresist composition of the present invention is suitable for exposure to a far ultraviolet ray, particularly a KrF excimer laser beam, improved in line edge roughness and also excellent in sensitivity, resolution, depth of focus and resist profile.

20 Claims, No Drawings

POSITIVE PHOTORESIST COMPOSITION

FIELD OF THE INVENTION

The present invention relates to a positive photosensitive composition for use in the production of a lithographic printing plate, a semiconductor such as IC, a circuit board for liquid crystal and thermal head and in other photofabrication processes. More specifically, the present invention relates to a positive photosensitive composition which is reactive to a radiation of high energy such as a far ultraviolet ray (including an excimer laser beam), an electron beam, an X-ray or the like and suitably used for the production of semiconductor integrated circuit.

BACKGROUND OF THE INVENTION

Hitherto, in the process for the production of semiconductor device such as IC or LSI, fine fabrication of lithography employing a photoresist composition has been conducted. Keeping step with the recent high integration degree of integrated circuits, the formation of ultrafine patterns in a range of submicrons to a quarter micron have been required. In order to meet such a requirement, a wavelength for exposure tends to become shorter, for example, from a g-line to an i-line and further to a KrF excimer laser beam. Nowadays, lithography using the excimer laser beam is the important fabrication technique in the field of art and as a resist suitable for the excimer laser lithographic process, a chemical amplification-type resist is employed.

The chemical amplification-type resist composition is a pattern formation material which generates an acid in an exposed area upon irradiation with a radiation such as a far ultraviolet ray and due to a reaction using the acid as a catalyst, solubility in a developing solution differentiates in the area irradiated with the active radiation from the non-irradiated area to form a pattern on a substrate. The chemical amplification-type resist has high sensitivity and resolution and also has an advantage in that an image can be formed by a compound which generates an acid (hereinafter also referred to as a "photo-acid generator" sometimes) upon irradiation with a small amount of radiation.

Examples of the chemical amplification-type positive photoresist composition include combinations of a compound capable of generating an acid by photolysis with an acetal or O,N-acetal compound as described in JP-A-48-89003 (the term "JP-A" as used herein means an "unexamined published Japanese patent application"), with an ortho ester or amide acetal compound as described in JP-A-51-120714, with a polymer having an acetal or ketal group on the main chain as described in JP-A-53-133429, with an enol ether compound as described in JP-A-55-12995, with an N-acyliminocarbonic acid compound as described in JP-A-55-126236, with a polymer having an ortho ester group on the main chain as described in JP-A-56-17345, with a tertiary alkyl ester compound as described in JP-A-60-3625, with a silyl ester compound as described in JP-A-60-10247 or with a silyl ether compound as described in JP-A-60-37549 and JP-A-60-121446.

A system which is stable at a room temperature but decomposes by heating in the presence of an acid to become alkali-soluble is also known and examples thereof include combinations of a compound capable of generating an acid on exposure with an ester or carbonic acid ester compound having a tertiary or secondary carbon (e.g., tert-butyl or 2-cyclohexenyl) as described, for example, in JP-A-59-45439, JP-A-60-3625, JP-A-62-229242, JP-A-63-27829, JP-A-63-36240, JP-A-63-250642, *Polym. Eng. Sce.,* Vol. 23, page 1012 (1983), *ACS. Sym.,* Vol. 242, page 11 (1984), *Semiconductor World,* November, 1987, page 91, *Macromolecules,* Vol. 21, page 1475 (1988), and *SPIE,* Vol. 920, page 42 (1988) Since such a system has high sensitivity and a little absorption in a far ultraviolet region, it is suitable for ultrafine fabrication using a light source having a shorter wavelength.

In general, the chemical amplification-type positive photoresist composition is roughly divided into three types. Specifically, there are (1) a chemical amplification-type positive photoresist of three-component type comprising an alkali-soluble resin, a photo-acid generator and a dissolution-inhibiting compound having an acid-decomposable group for the alkali-soluble resin, (2) a chemical amplification-type positive photoresist of two-component type comprising a resin having a group capable of being decomposed by a reaction with an acid to become alkali-soluble and a photo-acid generator and (3) a chemical amplification-type positive photoresist of hybrid type comprising a resin having a group capable of being decomposed by a reaction with an acid to become alkali-soluble, a low molecular weight dissolution-inhibiting compound having an acid-decomposable group and a photo-acid generator. Any of the two-component, three-component and hybrid chemical amplification-type positive photoresist compositions is subjected to exposure to generate an acid from the photo-acid generator, heat treatment and development thereby obtaining a resist pattern.

In the lithography using a chemical amplification-type photoresist composition, a photoresist which is excellent in various characteristics, for example, sensitivity, resolution, profile, coating aptitude, heat resistance, dry etching resistance, adhesion, substrate reliance, environment stability (e.g., dimension stability of the resist against fluctuation in a period of storage after the pattern exposure) and depth of focus (e.g., pattern-forming ability against defocusing at the irradiation with a radiation) is desired. Thus, various investigations for improving these characteristics utilizing additives has been made.

For instance, an attempt has been made to add an acid-scavenger to the chemical amplification-type photoresist to prevent the acid generated from diffusion, thereby improving the resist characteristics, particularly the environment stability based on the specific reaction mechanism thereof. Specifically, the addition of organic amine is proposed as described, for example, in JP-A-5-127369, JP-A-5-232706, JP-A-5-249662, JP-A-5-289322, JP-A-6-317902, JP-A-7-92678 and JP-A-7-120929. Although the addition of organic amine is effective for improving resolution, it causes a problem of decreasing sensitivity.

Also, for the purpose of increasing sensitivity or improving profile of resist pattern, many attempts have been made to add various compounds to the chemical amplification-type photoresist. For example, the addition of carboxylic acid is described, for example, in JP-A-5-181279, JP-A-7-92679, JP-A-9-6001, JP-A-9-6002, JP-A-9-6003, U.S. Pat. Nos. 5,955,240 and 5,948,589 and European Patent 679,951. The addition of aromatic polyhydroxy compound is described, for example, in JP-A-4-134345, JP-A-4-217251, JP-A-7-181680, JP-A-8-211597 and U.S. Pat. Nos. 5,688,628 and 5,972,559. The addition of sulfonamide compound is described, for example, in JP-A-5-181263 and JP-A-7-92680.

Further, the investigations for improving the resist characteristics such as resolution, exposure latitude, adhesion and substrate reliance have been made. For example, a method for preventing pattern failure by adding formamide or acetamide is proposed as described in JP-A-9-5987,U.S. Pat. No. 5,770,343 and European Patent 749,044. A method for improving substrate reliance by adding a nitrogen-containing compound such as succinimide or phthalimide is proposed as described in JP-A-11-44950. A method for improving environment stability (e.g., dimension stability of the resist against fluctuation in a period of storage after the pattern exposure), resolution and depth of focus by adding a compound which decreases its basicity upon exposure (photo-base) as described in JP-A-5-232706, JP-A-6-11835, JP-A-6-242606, JP-A-6-266100, JP-A-7-333851, JP-A-7-333844, U.S. Pat. No. 5,663,035 and European Patent 677,788.

Moreover, a method for improving resolution and depth of focus by adding a specific low molecular weight acid-decomposable dissolution-inhibiting compound to a two-component chemical amplification-type photoresist as described in JP-A-9-297396.

With photoresist compositions for exposure to a far ultraviolet ray, however, these techniques still have a problem in the property such as line edge roughness which is desired to be solved. The term "line edge roughness" used herein means unevenness of edge which occurs at an edge between a line pattern of resist and a surface of a substrate irregularly fluctuates in a direction vertical to the line due to the characteristics of resist, when the pattern is observed from just above. The unevenness is transferred in an etching step in which the resist acts as a mask and thus, electric properties are damaged thereby decreasing yield.

Particularly, as decreasing the resist pattern size to a quarter micron or less, a demand for improving the line edge roughness becomes strong. However, a guide to the improvement has scarcely known.

SUMMARY OF THE INVENTION

Therefore, an object of the present invention is to provide a positive photoresist composition for exposure to a far ultraviolet ray which is improved in the line edge roughness and is also excellent in various resist characteristics such as sensitivity, resolution, resist profile and depth of focus.

Other objects of the present invention will become apparent from the following description.

As a result of intensive investigations made by the inventors on materials for the chemical amplification-type positive photoresist compositions, it has been found that the objects of the present invention are successfully accomplished by using a specific nitrogen-containing compound to complete the present invention.

Specifically, the present invention includes the following positive photoresist compositions:

(1) a positive photoresist composition which comprises (A) a compound which generates an acid upon irradiation with an actinic ray or radiation, (B) a resin which is insoluble or sparingly soluble in alkali but becomes soluble in alkali by the action of an acid, and (C) a nitrogen-containing compound containing at least one partial structure represented by formula (I) shown below in its molecule:

(2) the positive photoresist composition as described in item (1) above, wherein the nitrogen-containing compound of (C) is a compound represented by formula (Ia) shown below:

wherein Ra represents a hydrogen atom, an alkyl group which may be substituted, an alkenyl group which may be substituted or an aryl group which may be substituted; Rb represents a hydrogen atom, an aryl group which may be substituted, —C(=O)—Ra or —N=N—Ra; or Ra and Rb may be connected with each other to form a ring, (3) the positive photoresist composition as described in item (1) above, wherein the nitrogen-containing compound of (C) is a compound represented by formula (II-1) shown below:

wherein R represents a monovalent organic residue having from 1 to 20 carbon atoms, (4) the positive photoresist composition as described in item (1) above, wherein the nitrogen-containing compound of (C) is a compound represented by formula (II-2) shown below:

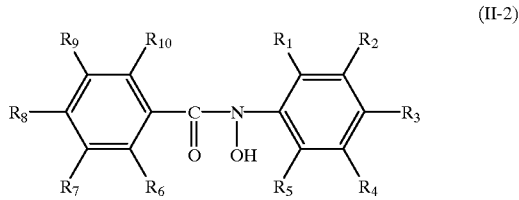

wherein $R_1$ to $R_{10}$, which may be the same or different, each represents a hydrogen atom, a hydroxy group, a halogen atom, a nitro group, a cyano group, an alkyl group, an alkoxy group, a hydroxyalkyl group, a cycloalkyl group or an aryl group, (5) the positive photoresist composition as described in any one of items (1) to (4) above, wherein the resin of (B) contains a repeating unit represented by formula (IV) shown below and a repeating unit represented by formula (V) shown below:

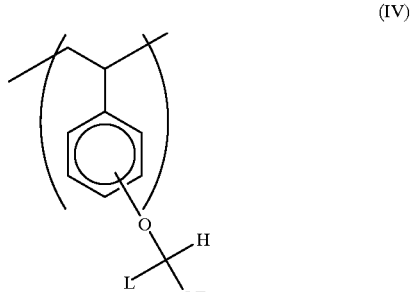

-continued (V)

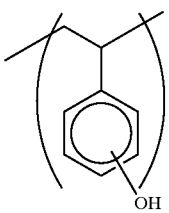

wherein L represents a hydrogen atom, a straight-chain, branched chain or cyclic alkyl group which may be substituted or an aralkyl group which may be substituted; Z represents a straight-chain, branched chain or cyclic alkyl group which may be substituted or an aralkyl group which may be substituted; or Z and L may be combined with each other to form a 5-membered or 6-membered ring, and (6) the positive photoresist composition as described in any one of items (1) to (5) above, wherein the composition further comprises (D) a nitrogen-containing basic compound as an acid-scavenger.

DETAILED DESCRIPTION OF THE INVENTION

The compounds for use in the positive photoresist composition of the present invention will be described in greater detail below.

<(C) Nitrogen-containing compound>

The nitrogen-containing compound of (C) for use in the present invention is a nitrogen-containing compound containing at least one partial structure represented by formula (I) shown below in its molecule:

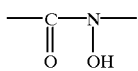

(I)

Of the compounds containing the partial structure represented by formula (I), a compound represented by formula (Ia) shown below is preferred:

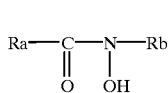

(Ia)

wherein Ra represents a hydrogen atom, an alkyl group which may be substituted, an alkenyl group which may be substituted or an aryl group which may be substituted; Rb represents a hydrogen atom, an aryl group which maybe substituted, —C(=O)—Ra or —N=N—Ra; or Ra and Rb may be connected with each other to form a ring.

The alkyl group described above includes an alkyl group having from 1 to 10 carbon atoms, preferably an alkyl group having from 1 to 4 carbon atoms, for example, methyl, ethyl, propyl, n-butyl, sec-butyl and tert-butyl.

The aryl group described above includes an aryl group having from 6 to 20 carbon atoms, preferably an aryl group having from 6 to 14 carbon atoms, for example, phenyl, xylyl, tolyl, cumenyl, naphthyl and antracenyl.

The alkenyl group described above includes an alkenyl group having from 1 to 4 carbon atoms, for example, vinyl, propenyl, allyl and butenyl.

A substituent for the alkyl group, alkenyl group or aryl group includes a halogen atom, a nitro group, a cyano group and a hydroxy group.

The ring formed by connecting Ra and Rb with each other includes rings contained in the structures of Compounds (C-4) to (C-7) described below.

Of the nitrogen-containing compounds of (C), a compound represented by formula (II-1) shown below is preferred:

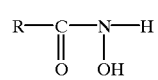

(II-1)

wherein R represents a monovalent organic residue having from 1 to 20 carbon atoms.

The monovalent organic residue having from 1 to 20 carbon atoms includes, for example, an alkyl group which may be substituted, a cycloalkyl group which may be substituted, an aryl group which may be substituted and an aralkyl group which may be substituted.

The alkyl group described above includes an alkyl group having from 1 to 10 carbon atoms, preferably an alkyl group having from 1 to 4 carbon atoms, for example, methyl, ethyl, propyl, n-butyl, sec-butyl and tert-butyl.

The cycloalkyl group described above includes a cycloalkyl group having from 3 to 15 carbon atoms, preferably a cycloalkyl group having from 3 to 10 carbon atoms, for example, cyclopropyl, cyclobutyl, cyclohexyl and adamantyl.

The aryl group described above includes an aryl group having from 6 to 20 carbon atoms, preferably an aryl group having from 6 to 14 carbon atoms, for example, phenyl, xylyl, tolyl, cumenyl, naphthyl and antracenyl.

The aralkyl group described above includes an aralkyl group having from 7 to 20 carbon atoms, preferably an aralkyl group having from 7 to 15 carbon atoms, for example, substituted or unsubstituted benzyl and substituted or unsubstituted phenethyl.

A substituent for the alkyl group, cycloalkyl group, aryl group or aralkyl group includes an alkyl group, an alkoxy group, a hydroxy group, a halogen atom, a nitro group and an acyl group.

Of the nitrogen-containing compounds of (C), a compound represented by formula (II-2) shown below is also preferred:

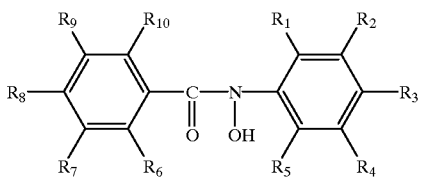

(II-2)

wherein $R_1$ to $R_{10}$, which may be the same or different, each represents a hydrogen atom, a hydroxy group, a halogen atom, a nitro group, a cyano group, an alkyl group, an alkoxy group, a hydroxyalkyl group, a cycloalkyl group or an aryl group.

The alkyl group described in formula (II-2) above includes preferably an alkyl group having from 1 to 4 carbon atoms, for example, methyl, ethyl, propyl, n-butyl, sec-butyl and tert-butyl. The cycloalkyl group described in formula (II-2) above includes preferably a cycloalkyl group having from 3 to 10 carbon atoms, for example, cyclopropyl, cyclobutyl, cyclohexyl and adamantyl. The aryl group described in formula (II-2) above includes preferably an aryl group having from 6 to 14 carbon atoms, for example, phenyl, xylyl, tolyl, cumenyl, naphthyl and antracenyl.

The alkoxy group described in formula (II-2) above includes preferably an alkoxy group having from 1 to 4 carbon atoms, for example, methoxy, ethoxy, hydroxyethoxy, propoxy, hydroxypropoxy, n-butoxy, isobutoxy, sec-butoxy and tert-butoxy.

The halogen atom described in formula (II-2) above includes fluorine, chlorine, bromine and iodine.

The hydroxyalkyl group described in formula (II-2) above includes preferably an hydroxyalkyl group having from 1 to 4 carbon atoms, for example, hydroxymethyl, hydroxyethyl, hydroxypropyl and hydroxybutyl.

Specific examples of the nitrogen-containing compound of (C) for use in the present invention are set forth below as Compounds (I-1) to (I-11) and (C-1) to (C-9), however, the present invention should not be construed as being limited thereto.

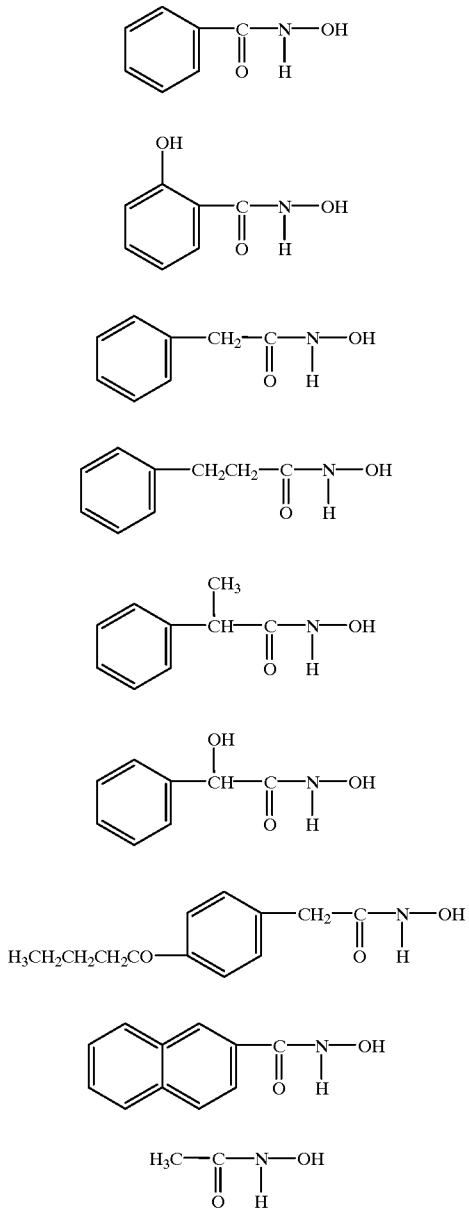
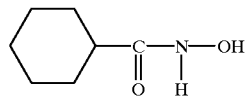
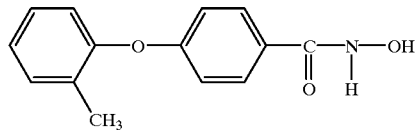
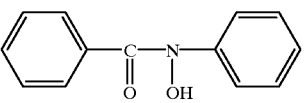
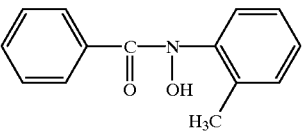
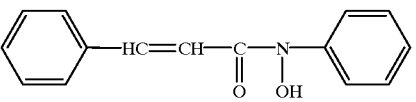
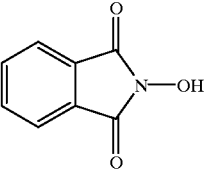
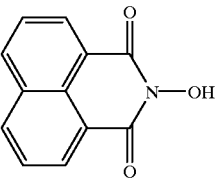
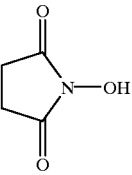
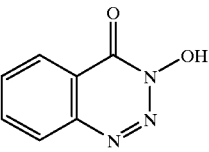

-continued (C-8)

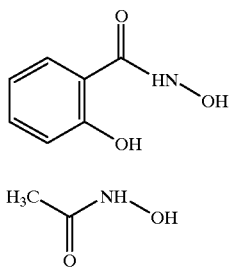

(C-9)

H₃C-C(=O)-NH-OH

The amount of the nitrogen-containing compound of (C) to be used in the present invention is usually from 0.001 to 40% by weight, preferably from 0.01 to 20% by weight, more preferably from 0.05 to 15% by weight, based on the solid content of the positive photoresist composition. If the amount of the nitrogen-containing compound of (C) is less than 0.001% by weight, the effect for improving the line edge roughness is insufficient, whereas if the amount added exceeds 40% by weight, disadvantageous effects such as deterioration of resist profile or narrowing of process margin may tend to occur.

<(A) Photo-Acid Generator>

The photo-acid generator of (A) for use in the present invention is a compound which generates an acid upon irradiation with an actinic ray or radiation.

The photo-acid generator for use in the present invention can be appropriately selected from photoinitiators for photo-cation polymerization, photoinitiators for photo-radical polymerization, photo-achromatizing agents for dyes, photo-discoloring agents and compounds which generate an acid by radiation conventionally used in a microresist or the like (an ultraviolet ray or far ultraviolet ray of from 400 to 200 nm, particularly preferably, a g-line, an h-line, an i-line or a KrF excimer laser beam), an ArF excimer laser beam, an electron beam, an X ray, a molecular beam or an ion beam. A mixture of these compounds can also be used.

Other examples of the photo-acid generator for use in the present invention include onium salts such as diazonium salts, ammonium salts, phosphonium salts, iodonium salts, sulfonium salts, selenonium salts or arsonium salts, organic halide compounds, organic metal/organic halide compounds, photo-acid generators having an o-nitrobenzyl type protective group, compounds which photolyze to generate a sulfonic acid, represented by iminosulfonate and the like, disulfone compounds, diazoketosulfone compounds and diazodisulfone compounds.

Also, polymer compounds having the group or compound generating an acid by irradiation introduced into the main or side chain thereof may be used.

Further, compounds which generate an acid by irradiation as described in V. N. R. Pillai, *Synthesis*, (1), 1 (1980), A. Abad et al., *Tetrahedron Lett.*, (47) 4555 (1971), D. H. R. Barton et al., *J. Chem. Soc.*, (C), 329 (1970), U.S. Pat. No. 3,779,778 and European Patent 126,712 may be used.

Among the above-described photo-acid generators of (A), those which can be particularly effectively used are described in <A-1> to <A-4> below.

<A-1> Oxazole derivative represented by formula (PAG1) shown below or s-triazine derivative represented by formula (PAG2) shown below, substituted with a trihalomethyl group:

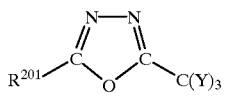
(PAG1)

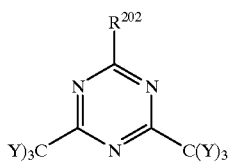
(PAG2)

wherein $R^{201}$ represents a substituted or unsubstituted aryl group or a substituted or unsubstituted alkenyl group; $R^{202}$ represents a substituted or unsubstituted aryl group, a substituted or unsubstituted alkenyl group, a substituted or unsubstituted alkyl group or $-C(Y)_3$; and Y represents a chlorine atom or a bromine atom.

Specific examples thereof include the following compounds, however, the present invention should not be construed as being limited thereto.

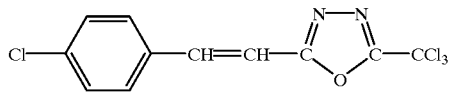
(PAG1-1)

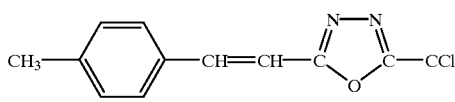
(PAG1-2)

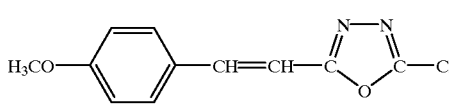
(PAG1-3)

(PAG1-4)

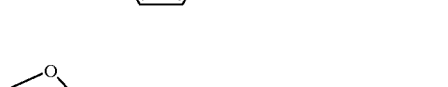
(PAG1-5)

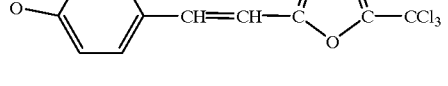
(PAG1-6)

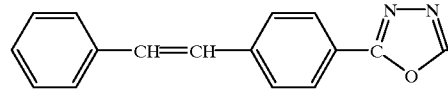
(PAG1-7)

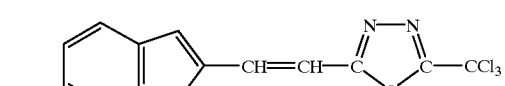
(PAG1-8)

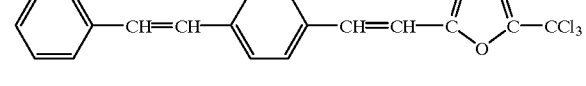

(PAG2-1)
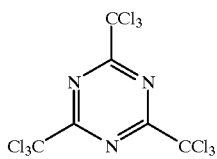
(PAG2-2)
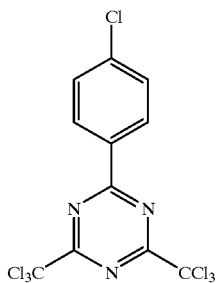
(PAG2-3)
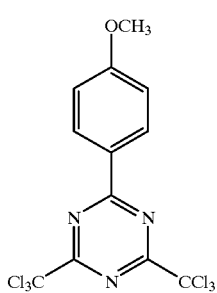
(PAG2-4)
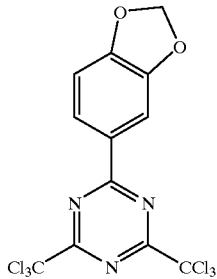
(PAG2-5)
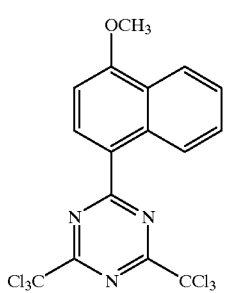
(PAG2-6)
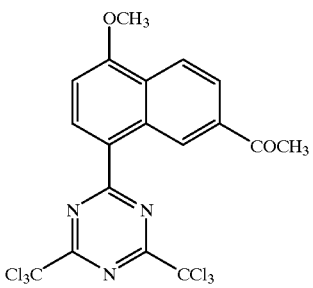
(PAG2-7)
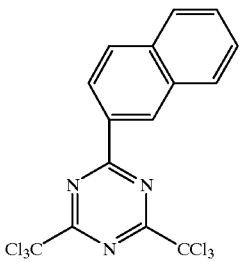
(PAG2-8)
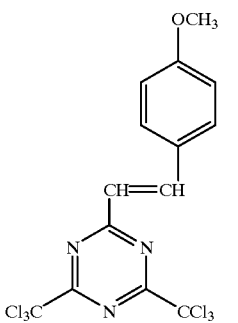
(PAG2-9)
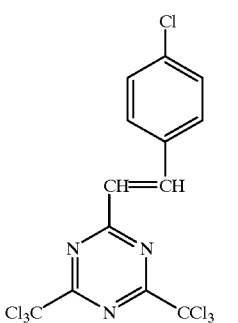
(PAG2-10)
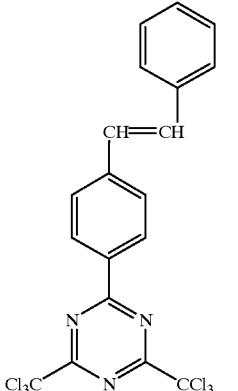

<A-2> Iodonium salt represented by formula (PAG3) shown below or sulfonium salt represented by formula (PAG4) shown below:

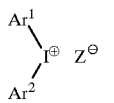
(PAG3)

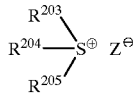
(PAG4)

wherein $Ar^1$ and $Ar^2$, which may be the same or different, each represents a substituted or unsubstituted aryl group; $R^{203}$, $R^{204}$ and $R^{205}$, which may be the same or different, each represents a substituted or unsubstituted alkyl group or a substituted or unsubstituted aryl group; and $Z^-$ represents a counter anion.

Examples of the counter anion include a perfluoroalkane sulfonate anion such as $BF_4^-$, $AsF_6^-$, $PF_6^-$, $SbF_6^-$, $SiF_6^{2-}$, $ClO_4^-$ and $CF_3SO_3^-$, an alkyl sulfonate anion such as camphor sulfonate anion, an aromatic sulfonate anion such as pentafluorobenzene sulfonate anion, benzene sulfonate anion and triisopropyl benzene sulfonate anion, a condensed polynuclear aromatic sulfonate anion such as naphthalene-1-sulfonate anion, anthraquinone sulfonate anion, and a sulfonic acid group-containing dye, however, the present invention should not be construed as being limited thereto. The anion moiety may further has a substituent.

Two of $R^{203}$, $R^{204}$ and $R^{205}$ or $Ar^1$ and $Ar^2$ may be combined through a single bond or a substituent.

Specific examples thereof include the following compounds, however, the present invention should not be construed as being limited thereto.

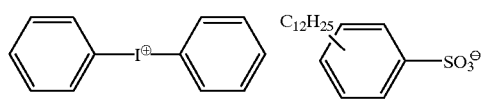
(PAG3-1)

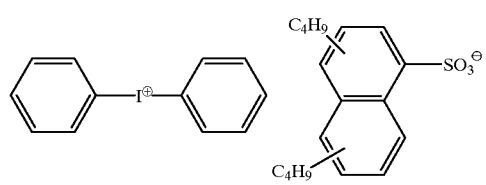
(PAG3-2)

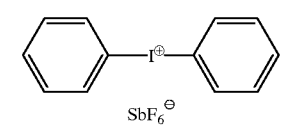
(PAG3-3)

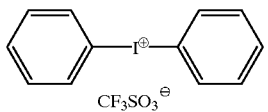
(PAG3-4)

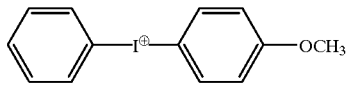
(PAG3-5)

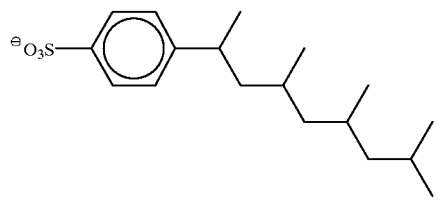
(PAG3-6)

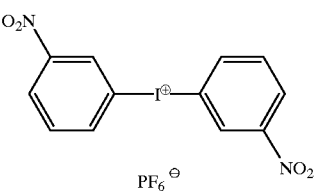
(PAG3-7)

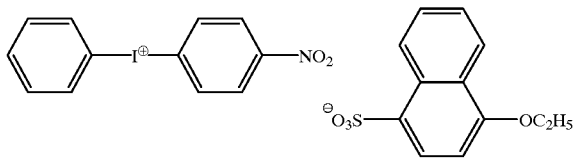
(PAG3-8)

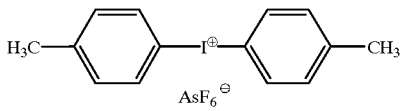
(PAG3-9)

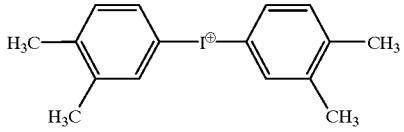
(PAG3-10)

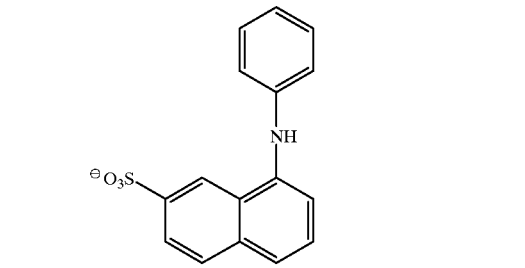

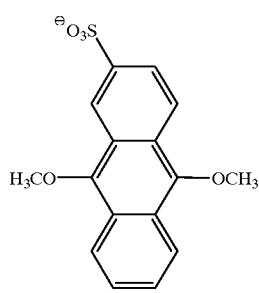
(PAG3-11)
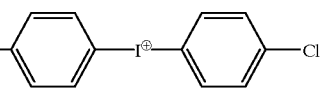
(PAG3-12)
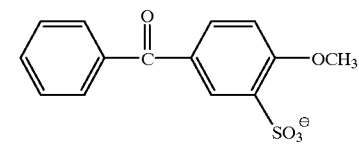
(PAG3-13)
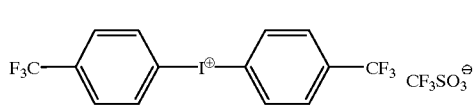
(PAG3-14)
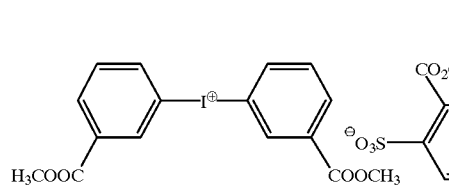
(PAG3-15)
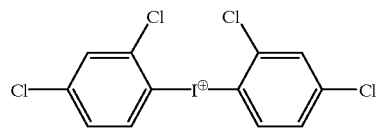
(PAG3-16)
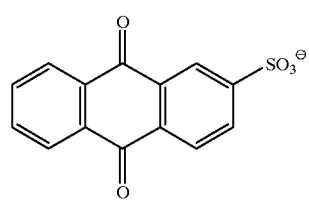
(PAG3-17)
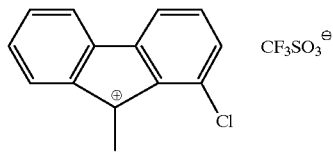
(PAG3-18)
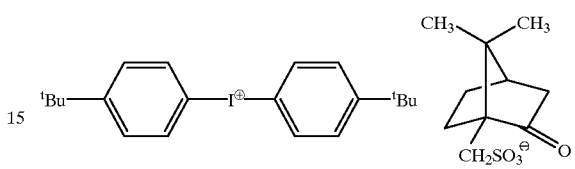
(PAG3-19)
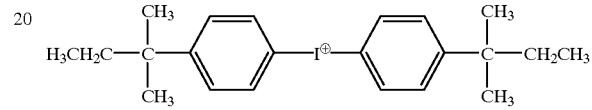
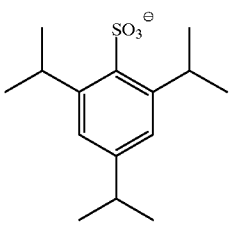
(PAG3-20)
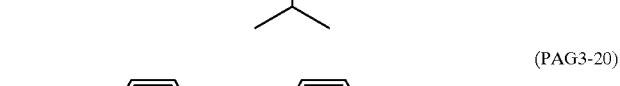
(PAG3-21)
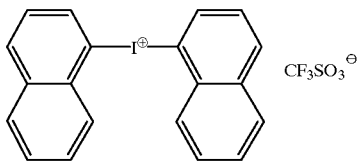
(PAG3-22)
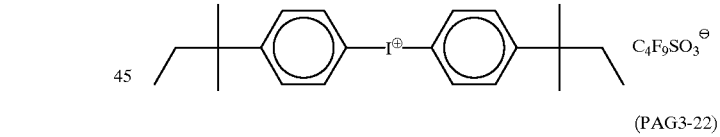
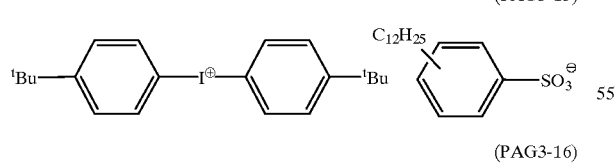
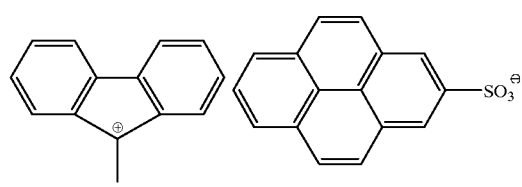
(PAG3-23)
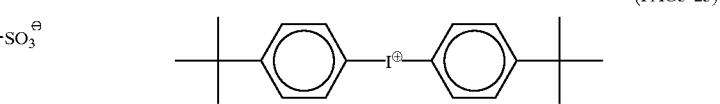
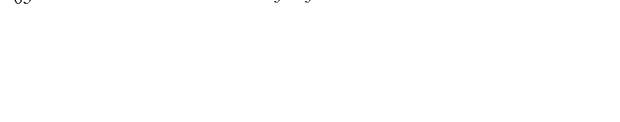

(PAG3-24)
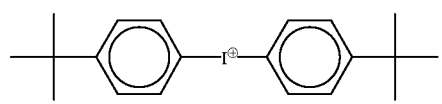
(PAG3-25)
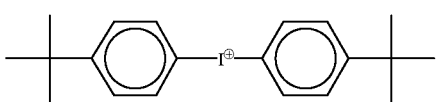
(PAG4-1)
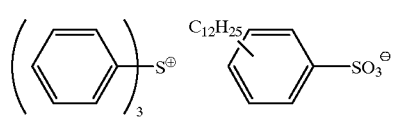
(PAG4-2)
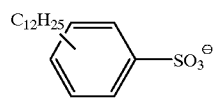
(PAG4-3)
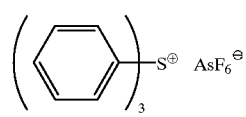
(PAG4-4)
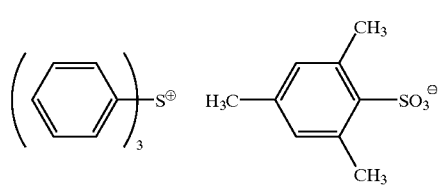
(PAG4-5)
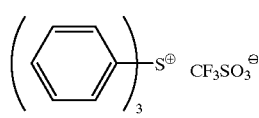
(PAG4-6)
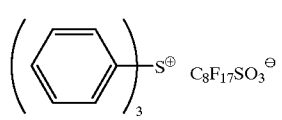
(PAG4-7)
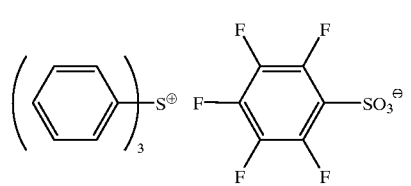
(PAG4-8)
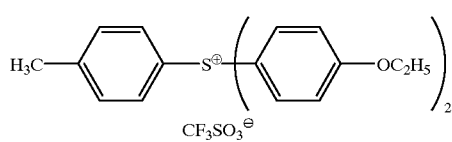
(PAG4-9)
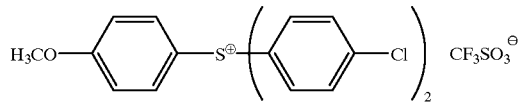
(PAG4-10)
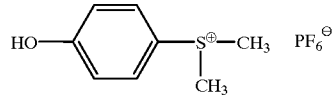
(PAG4-11)
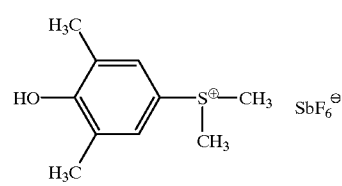
(PAG4-12)
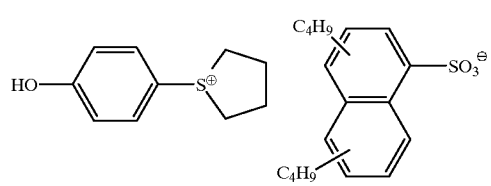
(PAG4-13)
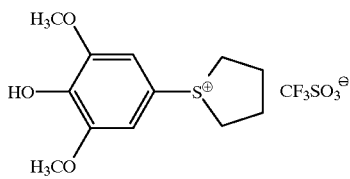
(PAG4-14)
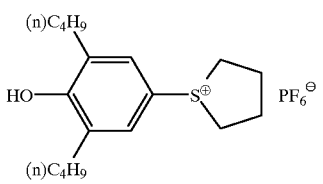
(PAG4-15)
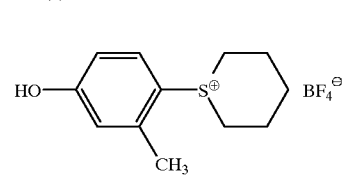
(PAG4-16)
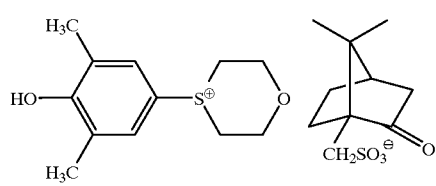

(PAG4-17), (PAG4-18), (PAG4-19), (PAG4-20), (PAG4-21), (PAG4-22), (PAG4-23), (PAG4-24), (PAG4-25), (PAG4-26), (PAG4-27), (PAG4-28), (PAG4-29), (PAG4-30), (PAG4-31)

(PAG4-32)
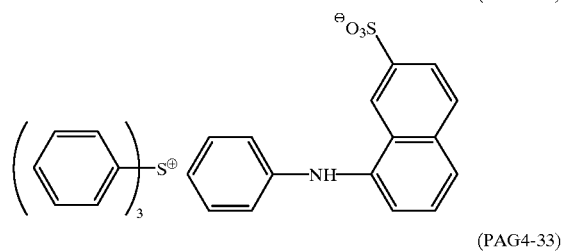

(PAG4-33)
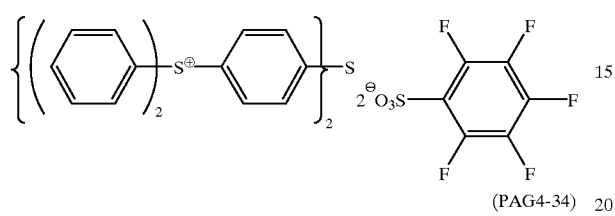

(PAG4-34)
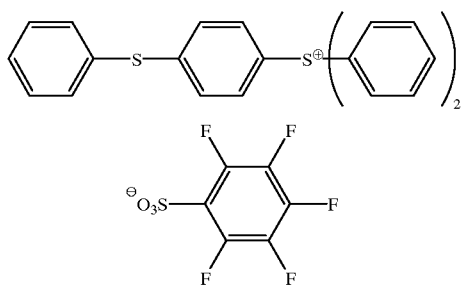

(PAG4-35)
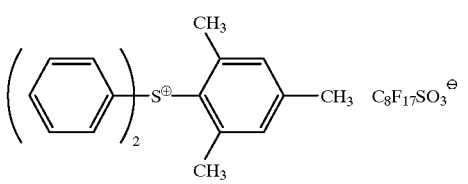

(PAG4-36)
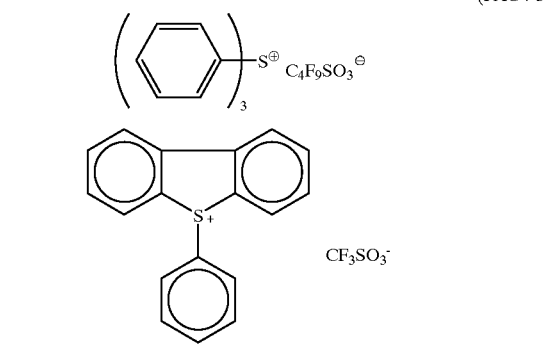

The onium salts represented by formulae (PAG3) and (PAG4) are known and can be synthesized by the methods described, for example, in J. W. Knapczyk et al., *J. Am. Chem. Soc.*, 91, 145 (1969), A. L. Maycok et al., *J. Org. Chem.*, 35, 2532 (1970), E. Goethas et al., *Bull. Soc. Chem. Belg.*, 73, 546 (1964), H. M. Leicester, *J. Ame. Chem. Soc.*, 51, 3587 (1929), J. V. Crivello et al., *J. Polym. Chem. Ed.*, 18, 2677 (1980), U.S. Pat. Nos. 2,807,648 and 4,247,473, and JP-A-53-101331.

<A-3> Disulfone derivative represented by formula (PAG5) shown below or iminosulfonate derivative represented by formula (PAG6) shown below:

$$Ar^3—SO_2—SO_2—Ar^4 \quad (PAG5)$$

(PAG6)
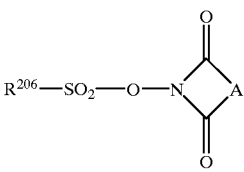

wherein $Ar^3$ and $Ar^4$, which may be the same or different, each represents a substituted or unsubstituted aryl group; $R^{206}$ represents a substituted or unsubstituted alkyl group or a substituted or unsubstituted aryl group; and A represents a substituted or unsubstituted alkylene group, a substituted or unsubstituted alkenylene group or a substituted or unsubstituted arylene group.

Specific examples thereof include the following compounds, however, the present invention should not be construed as being limited thereto.

(PAG5-1)
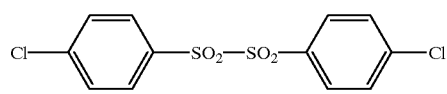

(PAG5-2)

(PAG5-3)
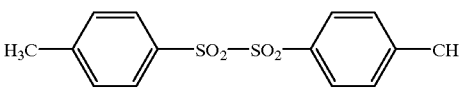

(PAG5-4)
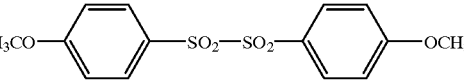

(PAG5-5)
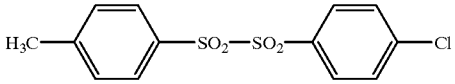

(PAG5-6)
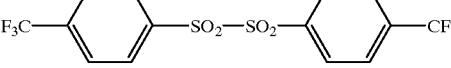

(PAG5-7)
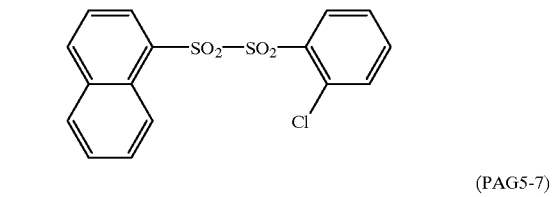

(PAG5-8)
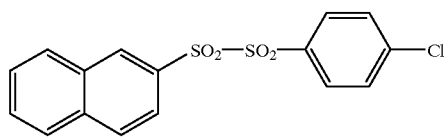
(PAG5-9)
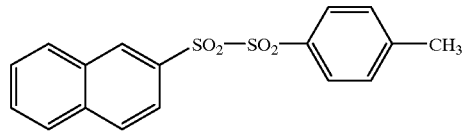
(PAG5-10)
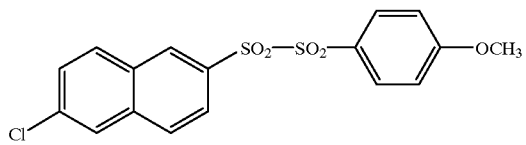
(PAG5-11)
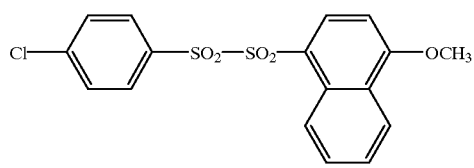
(PAG5-12)
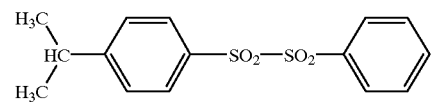
(PAG5-13)
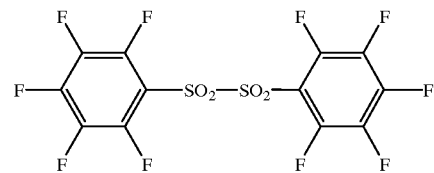
(PAG5-14)
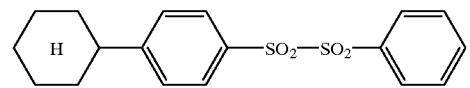
(PAG5-15)
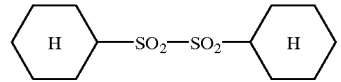
(PAG6-1)
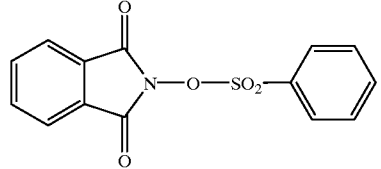
(PAG6-2)
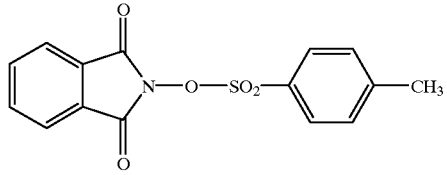
(PAG6-3)
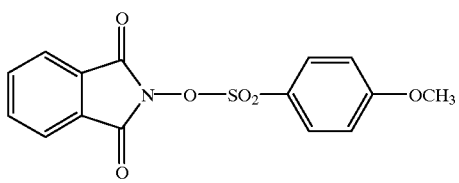
(PAG6-4)
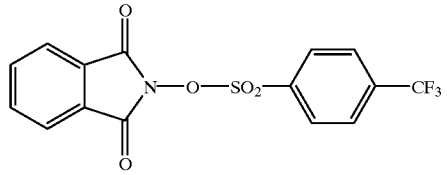
(PAG6-5)
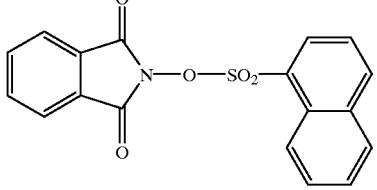
(PAG6-6)
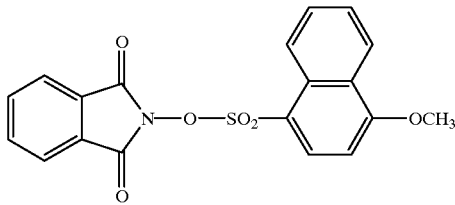
(PAG6-7)
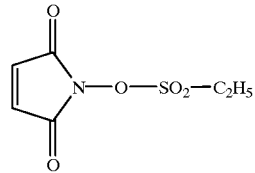
(PAG6-8)
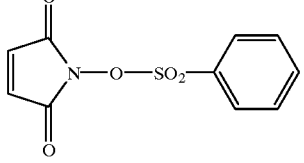

<A-4> Diazodisulfone derivative represented by formula (PAG7) shown below:

$$R-\underset{\underset{O}{\|}}{\overset{\overset{O}{\|}}{S}}-\underset{\|}{\overset{N_2}{C}}-\underset{\underset{O}{\|}}{\overset{\overset{O}{\|}}{S}}-R \quad \text{(PAG7)}$$

wherein R represents a straight-chain, branched chain or cyclic alkyl group or an aryl group which may be substituted.

Specific examples thereof include the following compounds, however, the present invention should not be construed as being limited thereto.

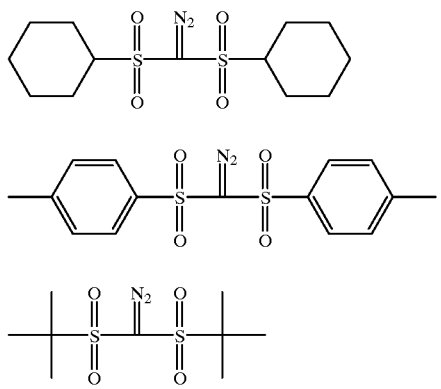

(PAG7-3)

(PAG7-4)

(PAG7-5)

The amount of the photo-acid generator of (A) to be used is usually from 0.001 to 40% by weight, preferably from 0.01 to 20% by weight, more preferably from 0.1 to 10% by weight, based on the solid content of the positive photoresist composition. If the amount of the photo-acid generator is less than 0.001% by weight, sensitivity of the resist composition is reduced, whereas if the amount added exceeds 40% by weight, the resist exhibits too much light absorption, resulting in causing disadvantageous effects such as deterioration of profile or narrowing of process margin.

<(B) Resin>

The resin of (B) for use in the positive photoresist composition of the present invention is a resin which is insoluble or sparingly soluble in alkali but becomes soluble in alkali by the action of an acid.

As the resin solubility of which increases in an alkaline developing solution by the action of an acid, a resin which contains a repeating unit corresponding to hydroxystyrene and which decomposes by the action of an acid to increase solubility in alkali is preferably used.

The hydroxystyrene can be any of o-, m- or p-hydroxystyrene and also may be partially hydrogenated. The hydroxystyrene may be substituted with other than the hydroxy group. Examples of the substituent include an alkyl group, an alkoxy group, an aralkyl group and an aryl group.

The resin having a group which decomposes with an acid and increases solubility in an alkaline developing solution (hereinafter also referred to as an "acid-decomposable group" sometimes) for use in the chemical amplification-type positive photoresist of the present invention is a resin having introduced an acid-decomposable group into the polymer main chain or side chain, or both the polymer main chain and side chain. A resin having an acid-decomposable group at the side chain is more preferred.

Preferred examples of the acid-decomposable group include a group represented by —COOA° and a group represented by —O—B°. Examples of a group containing such a group include a group represented by —R°—COOA° or a group represented by —Ar—O—B°.

In the above formulae, A° represents —C($R^{01}$)($R^{02}$)($R^{03}$) —Si($R^{01}$)($R^{02}$)($R^{03}$) or —C($R^{04}$)($R^{05}$)—O—$R^{06}$, and B° represents —A° or —CO—O—A°.

$R^{01}$, $R^{02}$, $R^{03}$, $R^{04}$ and $R^{05}$, which may be the same or different, each represents a hydrogen atom, an alkyl group, a cycloalkyl group, an alkenyl group or an aryl group, and $R^{06}$ represents an alkyl group or an aryl group. However, at least two of $R^{01}$ to $R^{03}$ are not hydrogen atoms; and two of $R^{01}$ to $R^{03}$ may be bonded to each other to form a ring, and two of $R^{04}$ to $R^{06}$ may be bonded to each other to form a ring.

$R^0$ represents a divalent aliphatic or aromatic hydrocarbon group which may be substituted, and —Ar— represents a divalent monocyclic or polycyclic aromatic group which may be substituted.

Preferred examples of the alkyl group include an alkyl group having from 1 to 4 carbon atoms, for example, methyl, ethyl, propyl, n-butyl, sec-butyl and tent-butyl. Preferred examples of the cycloalkyl group include a cycloalkyl group having from 3 to 10 carbon atoms, for example, cyclopropyl, cyclobutyl, cyclohexyl and adamanty. Preferred examples of the alkenyl group include an alkenyl group having from 2 to 4 carbon atoms, for example, vinyl, propenyl, allyl and butenyl. Preferred examples of the aryl group include an aryl group having from 6 to 14 carbon atoms, for example, phenyl, xylyl, tolyl, cumenyl, naphthyl and anthracenyl.

Examples of the substituent include a hydroxy group, a halogen atom (e.g., fluorine, chlorine, bromine and iodine), a nitro group, a cyano group, the above-described alkyl group, an alkoxy group such as methoxy, ethoxy, hydroxyethoxy, propoxy, hydroxypropoxy, n-butoxy, isobutoxy, sec-butoxy and tert-butoxy, an alkoxycarbonyl group such as methoxycarbonyl and ethoxycarbonyl, an aralkyl group such as benzyl, phenethyl and cumyl, an aralkyloxy group, an acyl group such as formyl, acetyl, butyryl, benzoyl, cyanamyl and valeryl, an acyloxy group such as butyryloxy, the above-described alkenyl group, an alkenyloxy group such as vinyloxy, propenyloxy, allyloxy and butenyloxy, the above-described aryl group, an aryloxy group such as phenoxy, an arylcarbonyloxy group such as benzoyloxy, and an aryloxycarbonyl group.

Examples of preferred acid-decomposable group (—COOA° or —O—B°) include a silyl ether group, a cumyl ester group, an acetal group, a tetrahydropyranyl ether group, an enol ether group, an enol ester group, a tertiary alkyl ether group, a tertiary alkyl ester group and a tertiary alkylcarbonate group. More preferred examples thereof include a tertiary alkyl ester group, a tertiary alkylcarbonate group, a cumyl ester group, an acetal group and a tetrahydropyranyl ether group. An acetal group is particularly preferred.

A parent resin in the case wherein the acid-decomposable groups are bonded as a side chain is an alkali-soluble resin having a repeating unit corresponding to the above-described hydroxystyrene and an —OH group or a —COOH group, preferably an —R°—COOH group or an —Ar—OH group, in the side chain. For instance, the alkali-soluble resins described below can be exemplified as such parent resins.

In view of attaining a rectangular profile, an alkali-soluble resin which highly transmit a far ultraviolet ray or an excimer laser beam is preferred. Specifically, an alkali-soluble resin whose 1 μm-thick film has transmittance at 248 nm of from 20% to 90% is preferred.

Especially preferred alkali-soluble resins from such a standpoint are poly(o-, m-, or p-hydroxystyrene), copolymer of such a hydroxystyrene, hydrogenated poly (hydroxystyrene), halogen- or alkyl-substituted poly (hydroxystyrene), partially O-alkylated or O-acylated poly (hydroxystyrene), styrene/hydroxystyrene copolymer, methylstyrene/hydroxystyrene copolymer and hydrogenated novolak resin.

The resin having the acid-decomposable group for use in the present invention can be obtained by reacting an alkali-soluble resin with a precursor of the acid-decomposable group or by copolymerizing a monomer for forming an alkali-soluble resin and having the acid-decomposable group bonded thereto with any of various monomers, as described, for example, in European Patent 254,853, JP-A-2-25850, JP-A-3-223860 and JP-A-4-251259.

Specific examples (1) to (18) of the resin of (B) having the acid-decomposable group for use in the present invention are set forth below, but the present invention should not be construed as being limited thereto.

(1): p-tert-Butoxystyrene/p-hydroxystyrene copolymer (2): p-(tert-Butoxycarbonyloxy)styrene/p-hydroxystyrene copolymer (3): p-(tert-Butoxycarbonylmethyloxy)styrene/p-hydroxystyrene copolymer (4): 4-(tert-Butoxycarbonylmethyloxy)-3-methylstyrene/4-hydroxy-3-methylstyrene copolymer (5): p-(tert-Butoxycarbonylmethyloxy)styrene/p-hydroxystyrene (10% hydrogenated)copolymer (6): m-(tert-Butoxycarbonylmethyloxy)styrene/m-hydroxystyrene copolymer (7): o-(tert-Butoxycarbonylmethyloxy)styrene/o-hydroxystyrene copolymer (8): p-(Cumyloxycarbonylmethyloxy)styrene/p-hydroxystyrene copolymer (9): p-(tert-Butoxycarbonylmethyloxy)styrene/p-hydroxystyrene/styrene copolymer (10): p-tert-Butoxystyrene/p-hydroxystyrene/fumaronitrile copolymer (11): p-Hydroxystyrene/tert-butyl methacrylate copolymer (12): Styrene/p-hydroxystyrene/tert-butyl methacrylate copolymer (13): p-Hydroxystyrene/tert-butyl acrylate copolymer (14): Styrene/p-hydroxystyrene/tert-butyl acrylate copolymer (15): p-(tert-Butoxycarbonylmethyloxy)styrene/p-hydroxystyrene/N-methylmaleimide copolymer (16): p-Hydroxystyrene/tert-butyl acrylate/p-(tert-butoxycarbonyloxy)styrene copolymer (17): p-Hydroxystyrene/tert-butyl acrylate/p-(tert-butoxycarbonylmethyloxy)styrene copolymer (18): p-Hydroxystyrene/tert-butyl acrylate/p-acetoxystyrene copolymer (see the structural formula shown below)

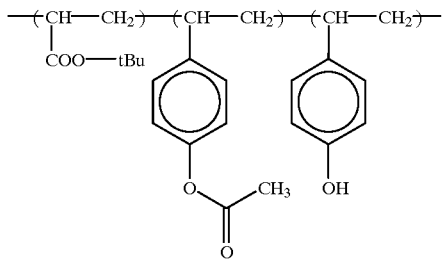

Of the resins of (B) having the acid-decomposable group according to the present invention, resins containing a repeating unit represented by formula (IV) and a repeating unit represented by formula (V) described below are preferred since they exhibit the effect of the present invention remarkably.

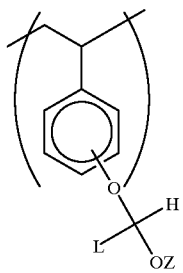

(IV)

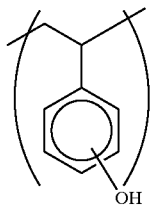

(V)

wherein L represents a hydrogen atom, a straight-chain, branched chain or cyclic alkyl group which maybe substituted or an aralkyl group which may be substituted; Z represents a straight-chain, branched chain or cyclic alkyl group which may be substituted or an aralkyl group which may be substituted; or Z and L may be combined with each other to form a 5-membered or 6-membered ring.

The straight-chain, branched chain or cyclic alkyl group for L and Z in formula (IV) includes that having from 1 to 20 carbon atoms, for example, methyl ethyl, propyl, isopropyl, n-butyl, isobutyl, tert-butyl, pentyl, cyclopentyl, hexyl, cyclohexyl, octyl and dodecyl.

Preferred examples of the substituent for the alkyl group include an alkyl group, an alkoxy group, a hydroxy group, a halogen atom, a nitro group, an acyl group, an acyloxy group, an acylamino group, a sulfonylamino group, an alkylthio group, an arylthio group, an aralkylthio group, a thiophenecarbonyloxy group, a thiophenemethylcarbonyloxy group and a heterocyclic moiety such as pyrrolidone moiety, and those having not more than 12 carbon atoms are more preferred.

Specific examples of the substituted alkyl group include cyclohexylethyl, alkylcarbonyloxymethyl, alkylcarbonyloxyethyl, arylcarbonyloxyethyl, aralkylcarbonyloxyethyl, alkyloxymethyl, aryloxymethyl, aralkyloxymethyl, alkyloxyethyl, aryloxyethyl, aralkyloxyethyl, alkylthiomethyl, arylthiomethyl, aralkylthiomethyl, alkylthioethyl, arylthioethyl and aralkylthioethyl.

The alkyl group contained in these groups is not particularly limited and includes any of straight-chain, branched chain and cyclic alkyl groups and may further has a substitutent such as those cited for the above-described alkyl group.

Examples of the above-described alkylcarbonyloxyethyl group include cyclohexylcarbonyloxyethyl, tert-butylcyclohexylcarbonyloxyethyl and n-butyl cyclohexylcarbonyloxyethyl.

The aryl group contained in these groups is also not particularly limited and includes those having from 6 to 14 carbon atoms, for example, phenyl, xylyl, tolyl, cumenyl, naphthyl and anthracenyl. The aryl group may be substituted with a substitutent such as those cited for the above-described alkyl group.

Examples of the above-described aryloxyethyl group include phenyloxyethyl and cyclohexylphenyloxyethyl.

The aralkyl group contained in these groups is also not particularly limited and includes a benzyl group.

Examples of the above-described aralkylcarbonyloxyethyl group include benzylcarbonyloxyethyl.

The aralkyl group for L and Z in formula (IV) includes that having from 7 to 15 carbon atoms, for example, a substituted or unsubstituted benzyl group and a substituted or unsubstituted phenethyl group.

Preferred examples of the substituent for the aralkyl group include an alkoxy group, a hydroxy group, a halogen atom, a nitro group, an acyl group, an acylamino group, a sulfonylamino group, an alkylthio group, an arylthio group and aralkylthio group. Specific examples of the substituted aralkyl group include alkoxybenzyl, hydroxybenzyl and phenylthiophenetyl. A range of carbon atoms included in the substituent for the aralkyl group represented by L or Z is preferably not more than 12.

To introduce a bulky group such as a phenyl group or a cyclohexyl group into the terminal of the substituted alkyl group or substituted aralkyl group is advantageous since further improvement in the line edge roughness is recognized.

The 5-membered or 6-membered ring formed by being combined with L and Z each other includes, for example, a tetrahydropyran ring and a tetrahydrofuran ring.

A molar ratio of the repeating unit represented by formula (IV)/the repeating unit represented by formula (V) present in the resin is preferably from 1/99 to 60/40, more preferably from 5/95 to 50/50 and still more preferably from 10/90 to 40/60.

The resin containing the repeating unit represented by formula (IV) and the repeating unit represented by formula (V) described above may further contain a repeating unit derived from other monomer.

Examples of the other monomer include a hydrogenated hydroxystyrene, a halogen-, alkoxy- or alkyl-substituted hydroxystyrene, styrene, a halogen-, alkoxy- acyloxy- or alkyl-substituted styrene, maleic anhydride, an acrylic acid derivative, a methacrylic acid derivative and an N-substituted maleimide, but the present invention should not be construed as being limited thereto.

A molar ratio of the repeating unit represented by formula (IV) and the repeating unit represented by formula (V)/the repeating unit of other monomer, i.e.,[(IV)+(V)]/[other monomer] present in the resin is ordinarily from 100/0 to 50/50, preferably from 100/0 to 60/40 and more preferably from 100/0 to 70/30.

Specific examples of the resin containing the repeating unit represented by formula (IV) and the repeating unit represented by formula (V) are set forth below, bur the present invention should not be construed as being limited thereto.

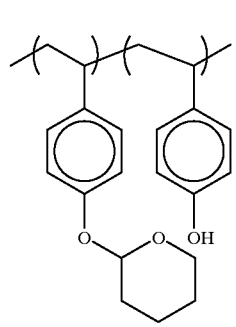

(IV-1)

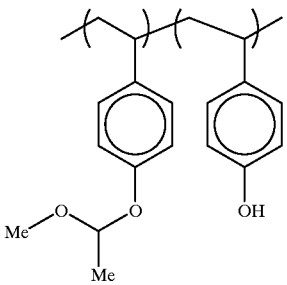

(IV-2)

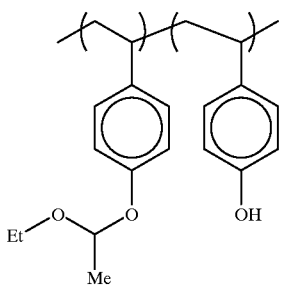

(IV-3)

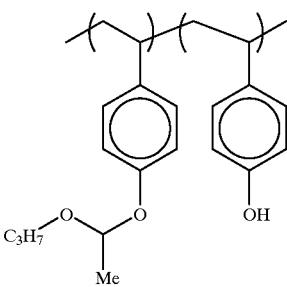

(IV-4)

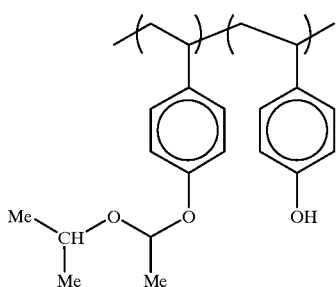

(IV-5)

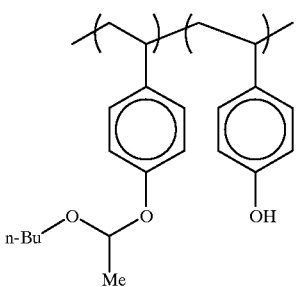

(IV-6)

-continued
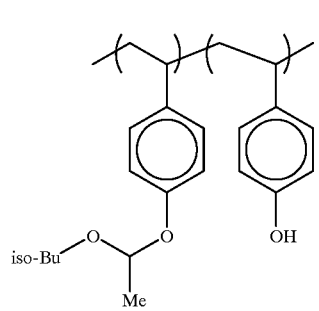
(IV-7)
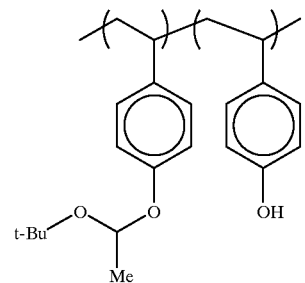
(IV-8)
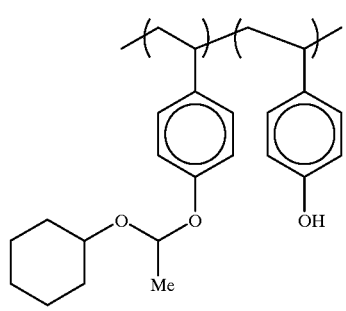
(IV-9)
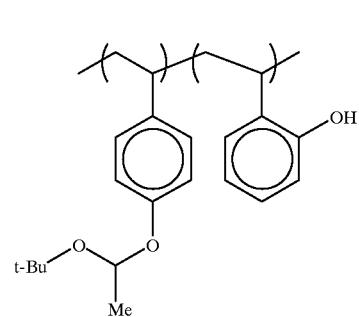
(IV-10)
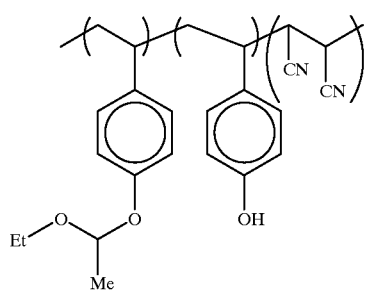
(IV-11)
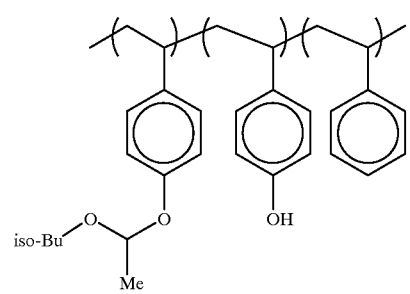
(IV-12)
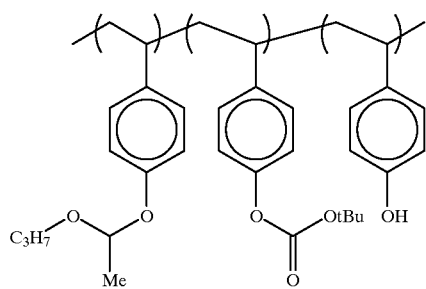
(IV-13)
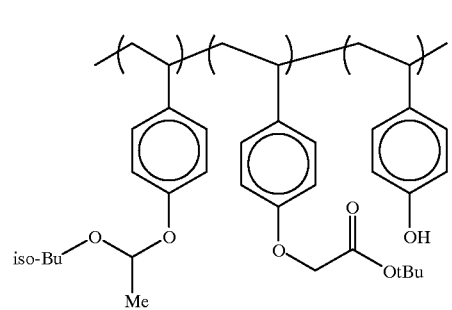
(IV-14)

-continued
(IV-15)
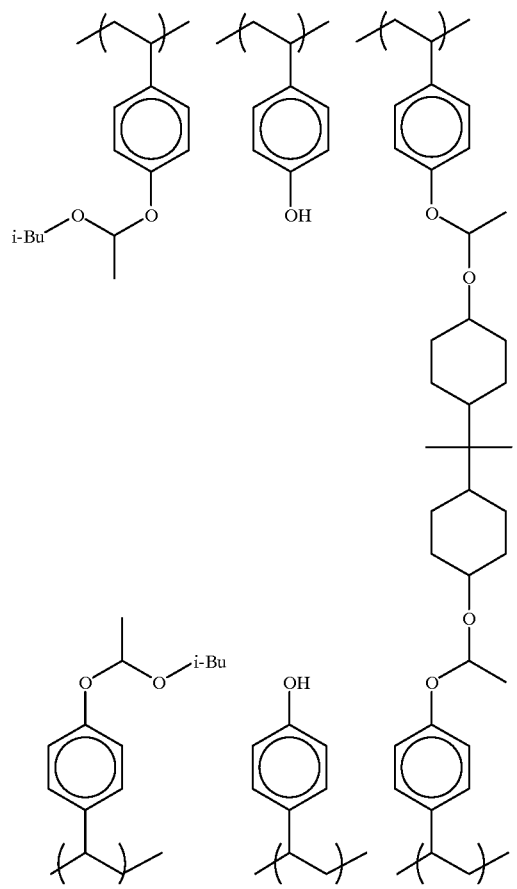
(IV-16)
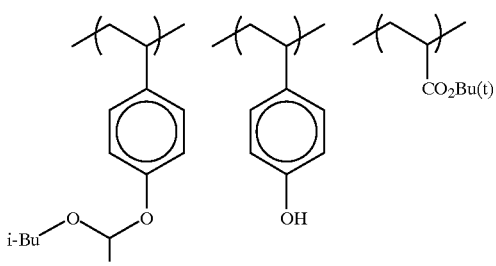
(IV-17)
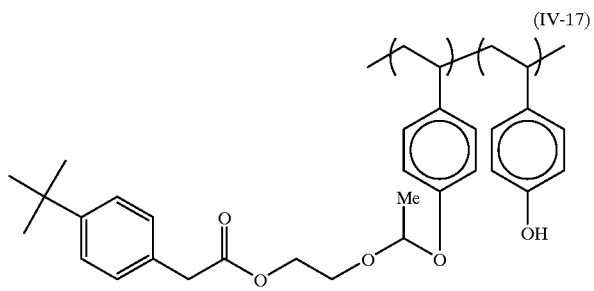
(IV-18)
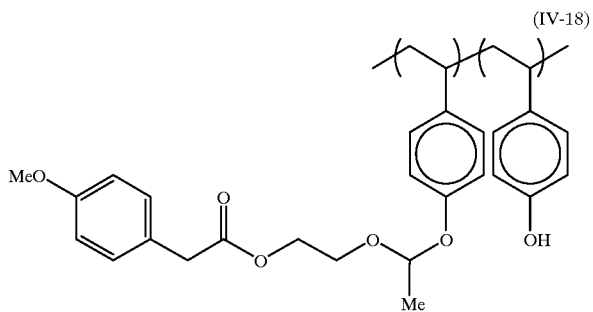
(IV-19)
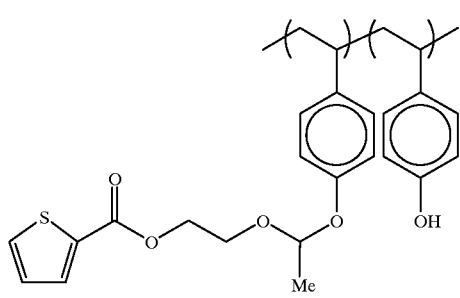
(IV-20)
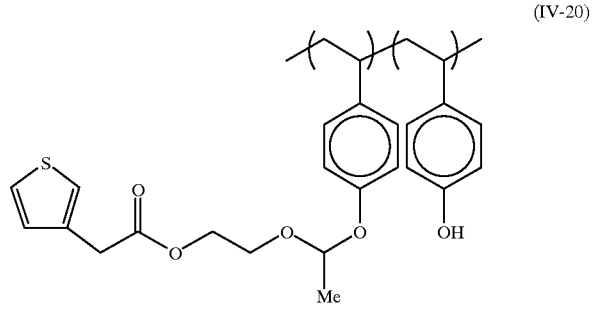

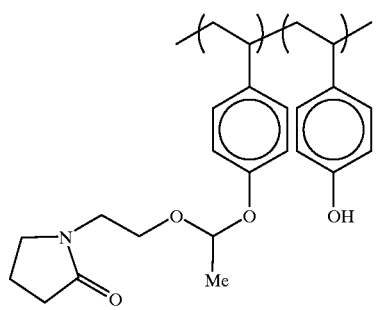
(IV-21)
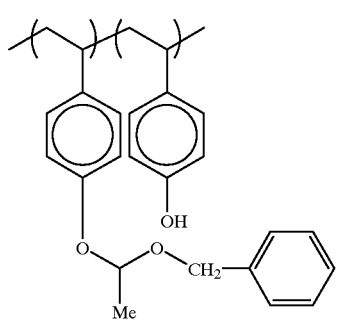
(IV-22)
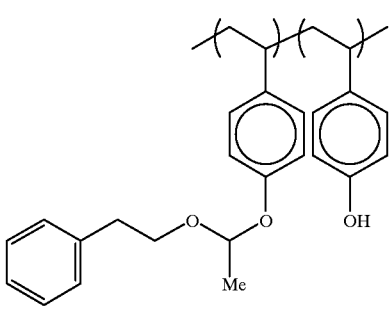
(IV-23)
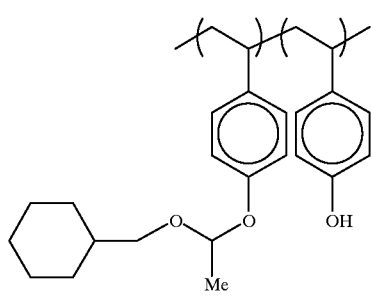
(IV-24)
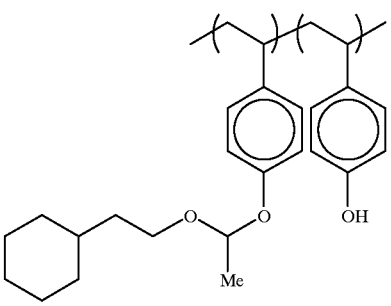
(IV-25)
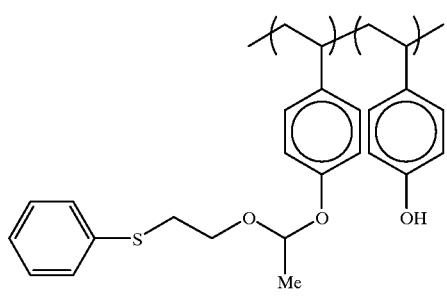
(IV-26)
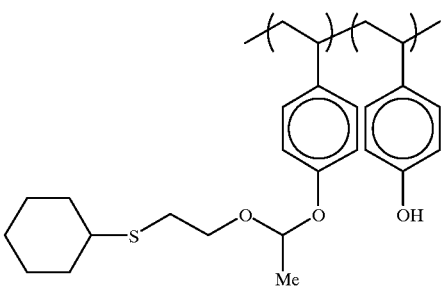
(IV-27)
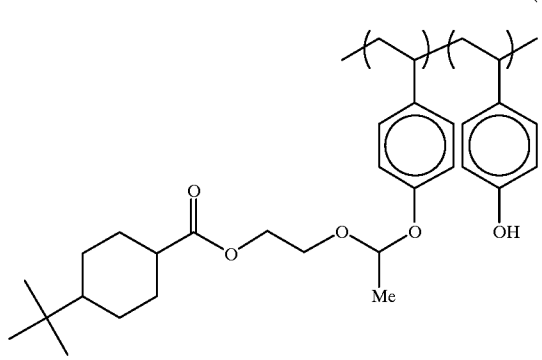
(IV-28)

(IV-29)
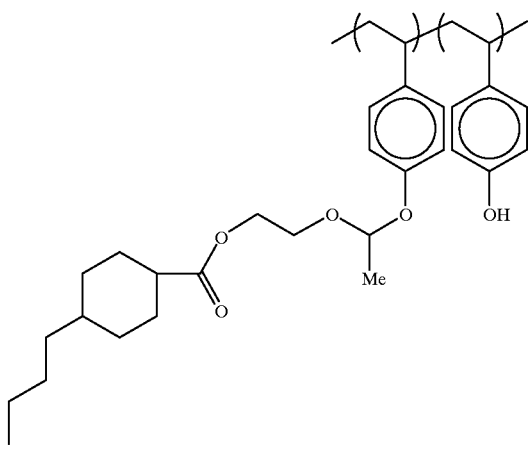
(IV-30)
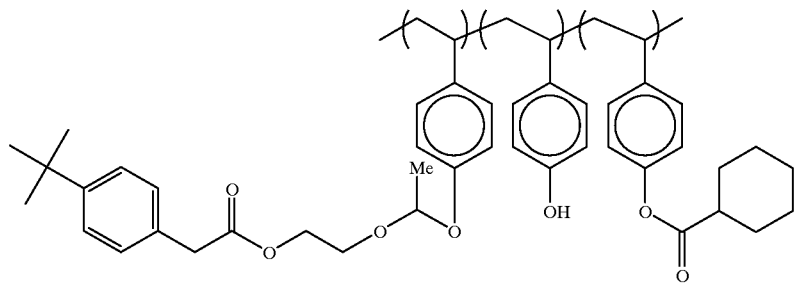
(IV-31)
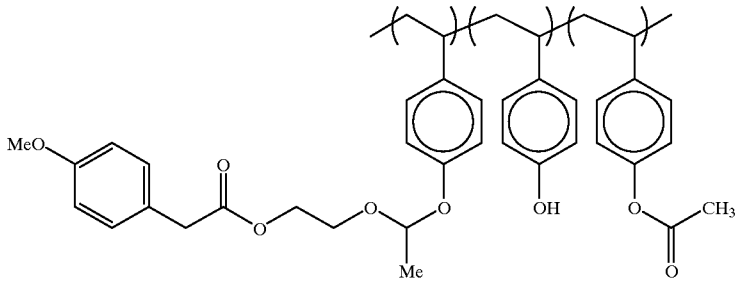
(IV-32)
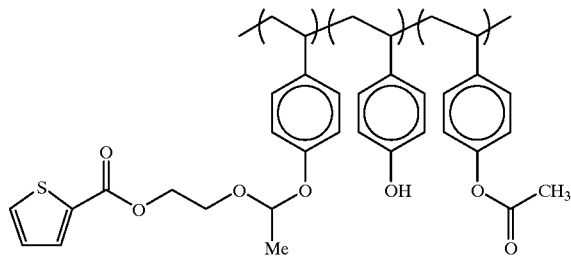
(IV-33)
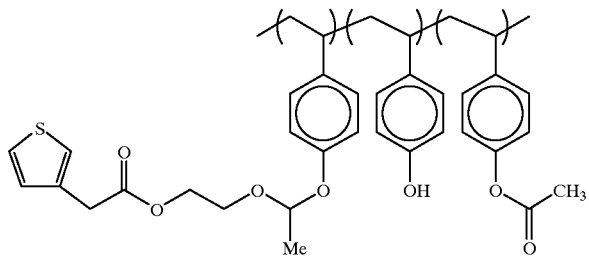

(IV-34)
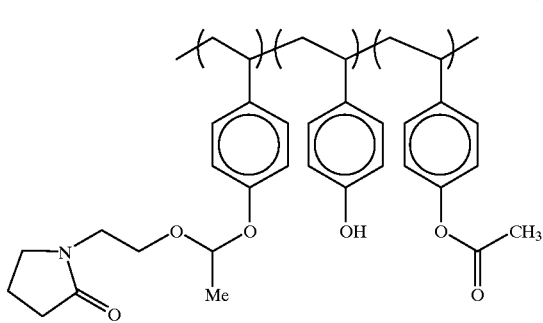
(IV-35)
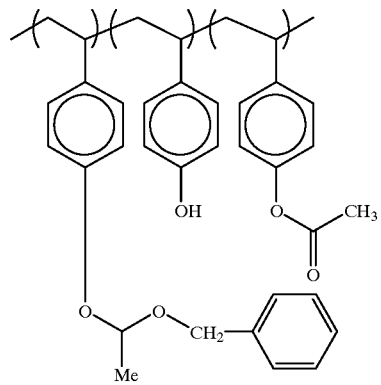
(IV-36)
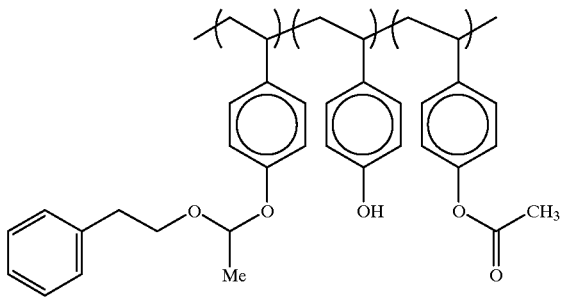
(IV-37)
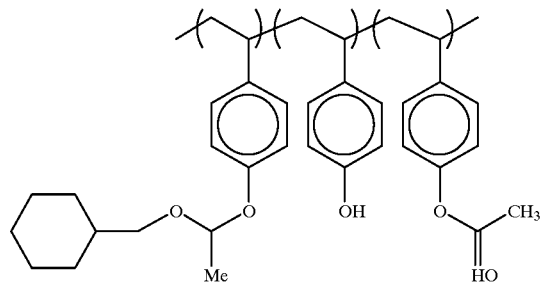
(IV-38)
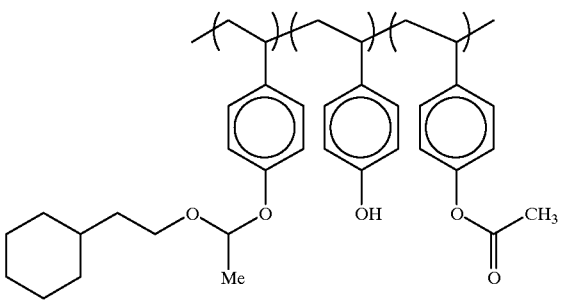
(IV-39)
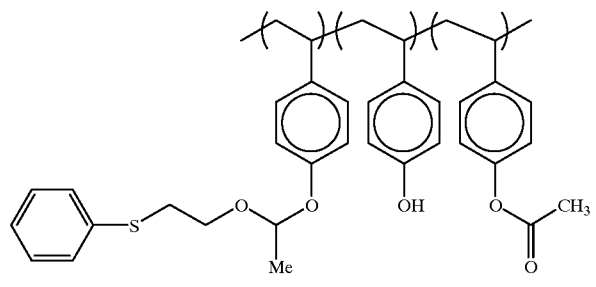
(IV-40)
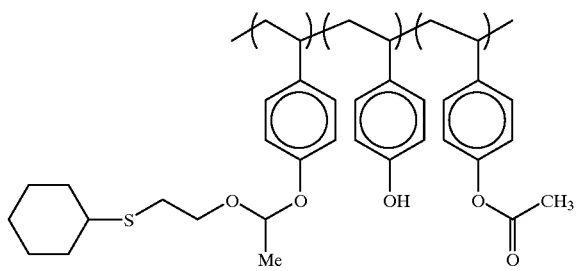
(IV-41)
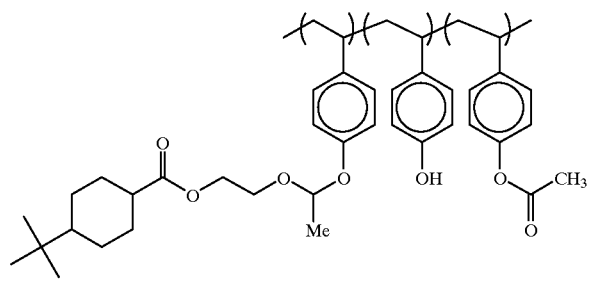

(IV-42) 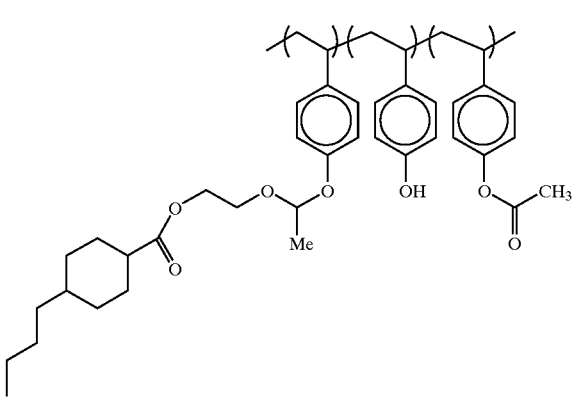 (IV-43) 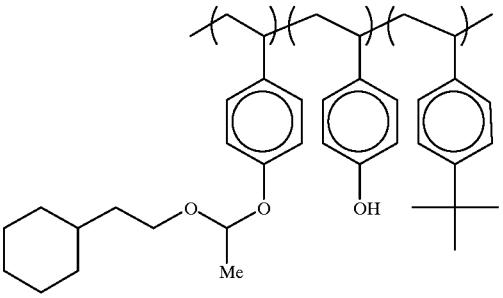

(IV-44) 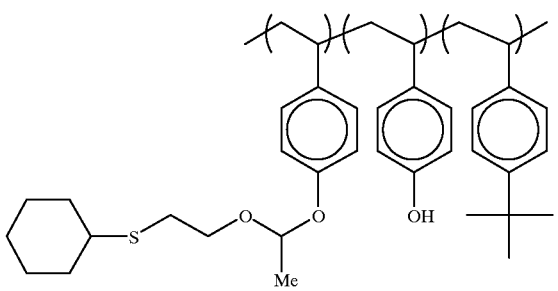 (IV-45) 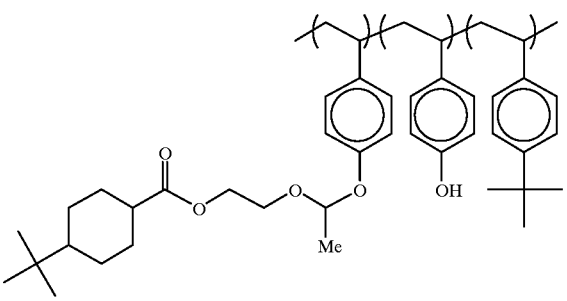

(IV-46) 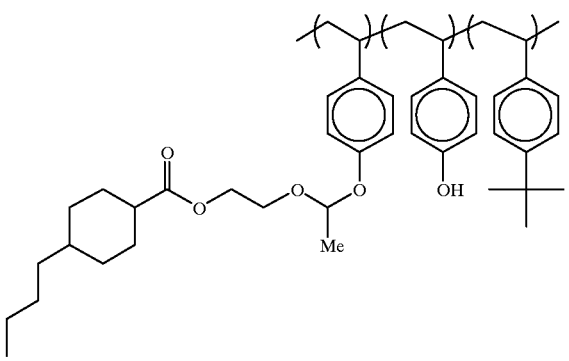 (IV-47) 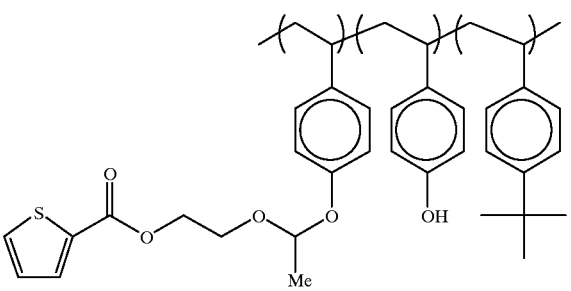

In the above-described formulae, Me represents a methyl group, Et represents an ethyl group, n-Bu represents a n-butyl group, iso-Bu represents an isobutyl group and t-Bu represents a tert-butyl group.

In case of using an acetal group as the acid-decomposable group, crosslinking portions connected with polyfunctional acetal groups may be introduced into the polymer main chain by means of adding a polyhydroxy compound in the preparation step thereof in order to control an alkali-soluble rate and to improve heat-resistance. The amount of the polyhydroxy compound added is preferably from 0.01 to 5 mol %, more preferably from 0.05 to 4 mol %, based on the content of hydroxy group in the resin. The polyhydroxy compound to be used have phenolic hydroxy groups or alcoholic hydroxy groups in an amount of 2 to 6, preferably from 2 to 4 and more preferably from 2 to 3.

Specific examples of the polyhydroxy compound are set forth below, bur the present invention should not be construed as being limited thereto.

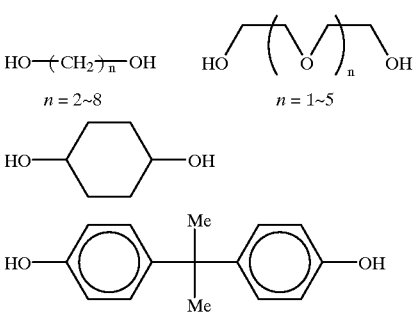

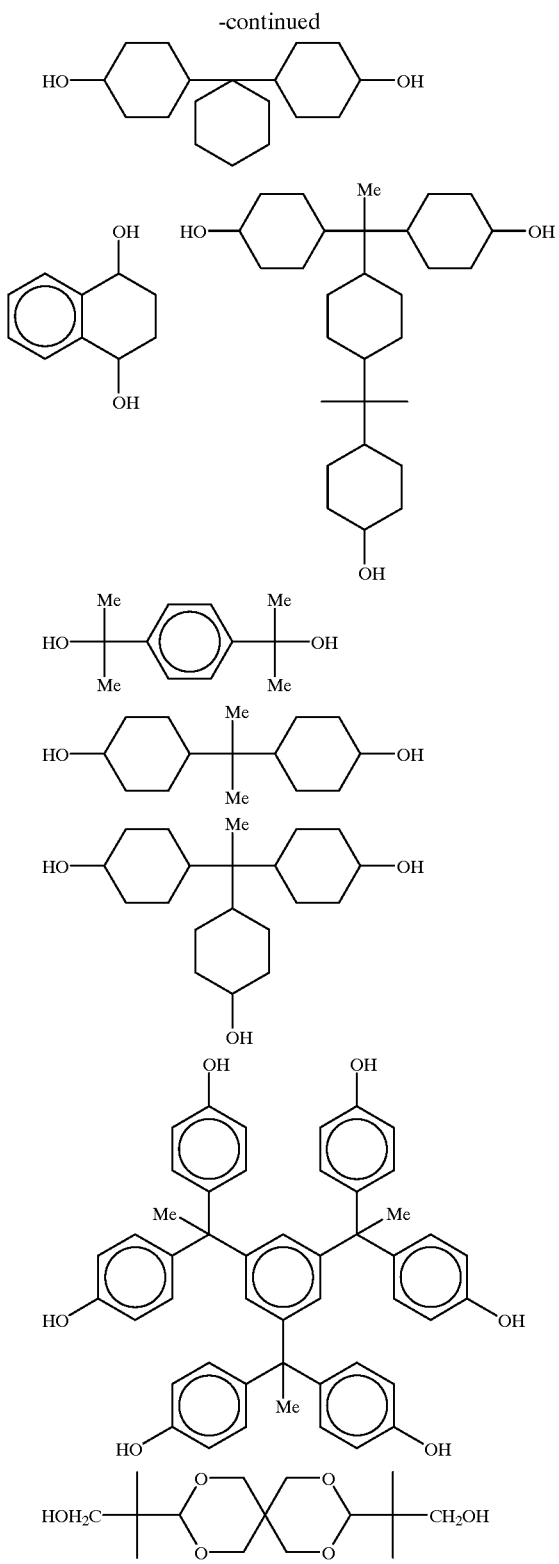

The content of repeating unit containing the acid-decomposable group in the resin of (B) according to the present invention is preferably from 5 to 50 mol %, more preferably from 10 to 40 mol %, based on the total repeating units.

The content of repeating unit corresponding to hydroxystyrene in the resin of (B) according to the present invention is preferably from 5 to 95 mol %, more preferably from 10 to 85 mol %, based on the total repeating units.

The weight average molecular weight (Mw) of the resin having the acid-decomposable group is preferably in a range of from 2,000 to 300,000. If it is less than 2,000, decrease in a film thickness of the unexposed area during development is large and on the other hand, if it exceeds 300,000, a dissolution rate of the resin per se to alkali decreases, resulting in lowering sensitivity. The weight average molecular weight is determined by gel permeation chromatography and calculated in terms of polystyrene.

The molecular weight distribution (weight average molecular weight/number average molecular weight) of the resin having an acid-decomposable group is preferably in a range of from 1.0 to 5.0. If the molecular weight distribution exceeds 5.0, undesirable decrease in resolution and formation of tapered resist pattern tend to occur.

Two or more of the resins of (B) having the acid-decomposable group may be used in the positive photoresist composition of the present invention.

The amount of resin of (B) is ordinarily from 40 to 99% by weight, preferably from 60 to 98% by weight, based on the total weight (excluding solvent) of the photoresist composition.

The positive photoresist composition of the present invention is dissolved in an appropriate solvent which can dissolve the above-described respective components, following by filtering through a filter, for example, a filter having a pore size of from about 0.05 μm to about 0.2 μm to prepare a solution of the photoresist composition.

Examples of the solvent used include ethylene glycol monoethyl ether, cyclohexanone, 2-heptanone, propylene glycol monomethyl ether, propylene glycol monomethyl ether acetate, propylene glycol monoethyl ether propionate, propylene glycol monomethyl ether acetate, methyl 3-methoxypropionate, ethyl 3-ethoxypropionate, methyl β-methoxyisobutyrate, ethyl butyrate, propyl butyrate, methyl isobutyl ketone, ethyl acetate, isoamyl acetate, ethyl lactate, toluene, xylene, cyclohexyl acetate, diacetone alcohol, N-methylpyrrolidone, N,N-dimethylformamide, γ-butyrolactone, N,N-dimethylacetamide, propylene carbonate and ethylene carbonate. The solvents may be used individually or in combination of two or more thereof. It is important to select the solvent since it has influence on the solubility, coating aptitude on a substrate and preservation stability of the positive photoresist composition of the present invention. Also, it is preferred that the moisture content in the solvent used is as low as possible since water adversely affects various resist characteristics.

Further, it is preferred to reduce a impurity component, for example, a metallic impurity such as metal and a chlorine ion in an amount of not more than 100 ppb in the positive photoresist composition of the present invention. If a large amount of impurity is present in the resist composition, operation inferior, defect or decrease of yield in the production of semiconductor device disadvantageously tends to occur.

The solid content of the positive photoresist composition dissolved in the solvent is preferably from 3 to 40% by weight, more preferably from 5 to 30% by weight and still more preferably from 7 to 20% by weight.

<(D) Organic basic compound>

It is preferred that the positive photoresist composition of the present invention further contains an organic basic compound as an acid-scavenger.

The organic basic compound which is used in the positive photoresist composition of the present invention is preferably a compound which has basicity stronger than phenol.

Particularly, the nitrogen-containing basic compound having a structure represented by formula (A), (B), (C), (D) or (E) shown below is preferably used. By the use of the nitrogen-containing basic compound, change in characteristics of the photoresist composition with the lapse of time from exposure to post-baking is restrained.

(A)

wherein $R^{250}$, $R^{251}$ and $R^{252}$, which may be the same or different, each represents a hydrogen atom, an alkyl group having from 1 to 6 carbon atoms, an aminoalkyl group having from 1 to 6 carbon atoms, a hydroxyalkyl group having from 1 to 6 carbon atoms or a substituted or unsubstituted aryl group having from 6 to 20 carbons atoms, or $R^{251}$ and $R^{252}$ may be combined with each other to form a ring;

(B)

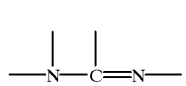

(C)

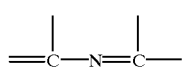

(D)

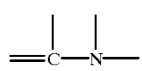

(E)

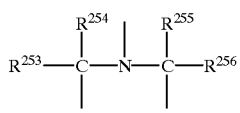

wherein $R^{253}$, $R^{254}$, $R^{255}$ and $R^{256}$, which maybe the same or different, each represents an alkyl group having from 1 to 6 carbon atoms.

More preferred organic basic compound is a nitrogen-containing cyclic compound or a nitrogen-containing basic compound having two or more nitrogen atoms of different chemical environment in its molecule.

The nitrogen-containing cyclic compound preferably has a polycyclic structure. Specific examples of preferred nitrogen-containing polycyclic compound include those represented by formula (VI) shown below.

(VI)

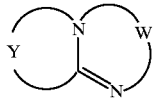

wherein Y and W, which may be the same or different, each represents a straight-chain, branched chain or cyclic alkylene group which may contain a hetero atom or may be substituted.

Examples of the hetero atom includes a nitrogen atom, a sulfur atom and an oxygen atom. The alkylene group preferably has from 2 to 10 carbon atoms, more preferably from 2 to 5 carbon atoms. Examples of the substituent for the alkylene group include an alkyl group having from 1 to 6 carbon atoms, an aryl group, an alkenyl group, a halogen atom and a halogen-substituted alkyl group.

Specific examples of the compound represented by formula (VI) are set forth below.

(VI-1)

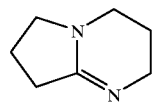

(VI-2)

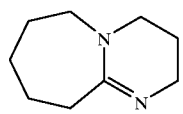

(VI-3)

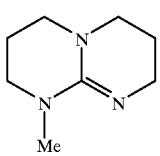

(VI-4)

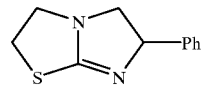

(VI-5)

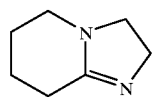

(VI-6)

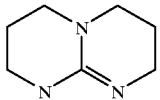

(VI-7)

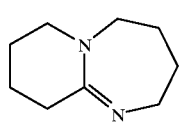

(VI-8)

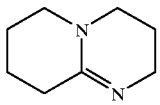

Particularly preferred examples of the compound represented by formula (VI) are 1,8-diazabicyclo[5. 4. 0]undec-7-ene and 1,5-diazabicyclo[4.3.0]non-5-ene.

Of the nitrogen-containing basic compounds having two or more nitrogen atoms of different chemical environment in their molecule, those particularly preferred include a compound containing both a substituted or unsubstituted amino group and a ring structure having a nitrogen atom and a compound having an alkylamino group. Preferred specific examples thereof include a substituted or unsubstituted guanidine, a substituted or unsubstituted aminopyridine, a substituted or unsubstituted aminoalkylpyridine, a substituted or unsubstituted aminopyrrolidine, a substituted or unsubstituted indazole, a substituted or unsubstituted pyrazole, a substituted or unsubstituted pyrazine, a substituted or unsubstituted pyrimidine, a substituted or unsubstituted purine, a substituted or unsubstituted imidazoline, a substituted or unsubstituted pyrazoline, a substituted or unsubstituted piperazine, a substituted or unsubstituted aminomorpholine and a substituted or unsubstituted aminoalkylmorpholine. Examples of preferred substituent include an amino group, an aminoalkyl group, an alkylamino group, an aminoaryl group, an arylamino group, an alkyl group, an alkoxy group, an acyl group, an acyloxy group, an aryl group, an aryloxy group, a nitro group, a hydroxy group and a cyano group.

Particularly preferred examples of the compound include guanidine, 1,1-dimethylguanidine, 1,1,3,3-tetramethylguanidine, 2-aminopyridine, 3-aminopyridine, 4-aminopyridine, 2-dimethylaminopyridine, 4-dimethylaminopyridine, 2-diethylaminopyridine, 2-(aminomethyl)pyridine, 2-amino-3-methylpyridine, 2-amino-4-methylpyridine, 2-amino-5-methylpyridine, 2-amino-6-methylpyridine, 3-aminoethylpyridine, 4-aminoethylpyridine, 3-aminopyrrolidine, piperazine, N-(2-aminoethyl)piperazine, N-(2-aminoethyl)piperidine, 4-amino-2,2,6,6-tetramethylpiperidine, 4-piperidinopiperidine, 2-iminopiperidine, 1-(2-aminoethyl) pyrrolidine, pyrazole, 3-amino-5-methylpyrazole, 5-amino-3-methyl-1-p-tolylpyrazole, pyrazine, 2-(aminomethyl)-5-methylpyrazine, pyrimidine, 2,4-diaminopyrimidine, 4,6-dihydroxypyrimidine, 2-pyrazoline, 3-pyrazoline, N-aminomorpholine, N-(2-aminoethyl)morpholine, timethylimidazole, triphenylimidazole and methyldiphenylimidazole. However, the present invention should not be construed as being limited thereto.

The nitrogen-containing basic compounds are used individually or in combination of two or more thereof in the present invention. The amount of the nitrogen-containing basic compound used is ordinarily from 0.001 to 10 parts by weight, preferably from 0.01 to 5 parts by weight, based on 100 parts by weight of the solid content in the photoresist composition. If the amount is less than 0.001 parts by weight, the effect of the nitrogen-containing basic compound added is not obtained. On the other hand, if the amount exceeds 10 parts by weight, reduction in sensitivity or deterioration of developing property tends to occur.

<(E) Other additives>

The positive photoresist composition of the present invention may further contain, if desired, a surface active agent, an acid-decomposable dissolution-inhibiting compound, a dye, a plasticizer, a photosensitizer, a crosslinking agent, a photo-base generator, a heat-base generator, a spectral sensitizer, a compound which accelerates solubility in a developing solution, a compound which decreases basicity upon exposure (photo-base) and the like.

The surface active agent which can be used in the positive photoresist composition of the present invention preferably includes a fluorine-base and/or silicon-base surface active agent. Any one of a fluorine-base surface active agent, a silicon-base surface active agent and a surface active agent containing both a fluorine atom and a silicon atom or a mixture of two or more thereof can be used.

Examples of the fluorine-base and/or silicon-base surface active agent include those described, for example, in JP-A-62-36663, JP-A-61-226746, JP-A-61-226745, JP-A-62-170950, JP-A-63-34540, JP-A-7-230165, JP-A-8-62834, JP-A-9-54432, JP-A-9-5988, U.S. Pat. Nos. 5,405,720, 5,360,692, 5,529,881, 5,296,330, 5,436,098, 5,576,143, 5,294,511 and 5,824,451. Commercially available surface active agents are also employed as they are.

Examples of commercially available surface active agent which can be used include a fluorine-base surface active agent and a silicon-base surface active agent, for example, Eftop EF301 and EF303 (manufactured by Shin Akita Chemical Co., Ltd.), Florad FC430 and FC431 (manufactured by Sumitomo 3M Ltd.), Megafac F171, F173, F176, F189 and R08 (manufactured by Dainippon Ink and Chemicals, Inc.), Surflon S-382, SC101, SC102, SC103, SC104, SC105 and SC106 (manufactured by Asahi Glass Co., Ltd.), and Troysol S-366 (manufactured by Troy Chemical Co., Ltd.). Also, polysiloxane polymer KP-341 (manufactured by Shin-Etsu Chemical Co., Ltd.) is employed as the silicon-base surface active agent.

The amount of such a surface active agent added is ordinarily from 0.001 to 2% by weight, preferably from 0.01 to 1% by weight, based on the solid content in the photoresist composition of the present invention. The surface active agents may be used individually or in combination of two or more thereof.

In the present invention, a surface active agent other than the fluorine-base and/or silicon-base surface active agent described above may be used. Specific examples thereof include a nonionic surface active agent, for example, a polyoxyethylene alkyl ether such as polyoxyethylene lauryl ether, polyoxyethylene stearyl ether, polyoxyethylene cetyl ether and polyoxyethylene oleyl ether, a polyoxyethylene alkylaryl ether such as polyoxyethylene octylphenol ether and polyoxyethylene nonylphenol ether, a polyoxyethylene/polyoxypropylene block copolymer, a sorbitan fatty acid ester such as sorbitan monolaurate, sorbitan monopalmitate, sorbitan monostearate, sorbitan monooleate, sorbitan trioleate and sorbitan tristearate, and a polyoxyethylene sorbitan fatty acid ester such as polyoxyethylene sorbitan monolaurate, polyoxyethylene sorbitan monopalmitate, polyoxyethylene sorbitan monostearate, polyoxyethylene sorbitan trioleate and polyoxyethylene sorbitan tristearate.

The amount of the surface active agent other than the fluorine-base and/or silicon-base surface active agent used is ordinarily not more than 2 parts by weight, preferably not more than 1 part by weight, based on 100 parts by weight of the solid content in the photoresist composition of the present invention.

The acid-decomposable dissolution-inhibiting compound which can be used in the positive photoresist composition of the present invention includes low molecular weight acid-decomposable dissolution-inhibiting compounds as described, for example, in JP-A-5-134415 and JP-A-6-51519.

The plasticizer which can be used in the positive photoresist composition of the present invention includes compounds as described, for example, in JP-A-4-212960, JP-A-8-262720, European Patents 735,422, 416,873 and 439,371 and U.S. Pat. No. 5,846,690. Specific examples thereof include di(2-ethylhexyl) adipate, n-hexyl benzoate, di(n-octyl) phthalate, di(n-butyl) phthalate, benzyl n-butyl phthalate and dihydroabietyl phthalate.

The compound which accelerates solubility in a developing solution for use in the positive photoresist composition of the present invention includes polyhydroxy compounds as described, for example, in JP-A-4-134345, JP-A-4-217251, JP-A-7-181680, JP-A-8-211597, U.S. Pat. Nos. 5,688,628 and 5,972,559. Aromatic polyhydroxy compounds, for example, 1,1-bis(4-hydroxyphenyl) cyclohexane, 4,4-(α-methylbenzylidene)bisphenol, α,α', α"-tris(4-hydroxyphenyl)-1,3,5-triisopropylbenzene, α, α', α"-tris (4-hydroxyphenyl)-1-ethyl-4-isopropylbenzene, 1,2,2-tris(4-hydroxyphenyl)propane, 1,1,2-tris(3,5-dimethyl-4-hydroxyphenyl)propane, 2,2,5,5-tetrakis(4-hydroxyphenyl) hexane, 1,2-bis(4-hydroxyphenyl)ethane, 1,3,3-tris(4-hydroxyphenyl)butane and para[α,α,α',α'-tetrakis(4-hydroxyphenyl)]xylene are preferably used. Also, an organic acid, for example, salicylic acid, diphenolic acid and phenolphthalane can be used. Further, a sulfonamide compound as described in JP-A-5-181263 and JP-A-7-92680, a carboxylic acid and carboxylic acid anhydride as described in JP-A-4-248554 and JP-A-5-181279 and JP-A-7-92679, and an alkali-soluble resin such as a polyhydroxystylene resin as described in JP-A-11-153869 are also used.

The dye suitably used in the present invention include an oil dye and a basic dye. Specific examples thereof include Oil Yellow #101, Oil Yellow #103, Oil Pink #312, Oil Green BG, Oil Blue BOS, Oil Blue #603, Oil Black BY, Oil Black BS, Oil Black T-505 (all are manufactured by Orient Chemical Industries Co., Ltd.), Crystal Violet (CI42555), Methyl Violet (CI42535), Rhodamine B (CI45170B), Malachite Green (CI42000) and Methylene Blue (CI52015).

Further, to the positive photoresist composition of the present invention may added an ammonium salt as described, for example, in JP-A-7-28247, European Patent 616,258, U.S. Pat. No. 5,525,443, JP-A-9-127700, European Patent 762,207 and U.S. Pat. No. 5,783,354, and including specifically tetramethyl ammonium hydroxide, tetra-n-butyl ammonium hydroxide and betaine. Moreover, a compound which decreases basicity upon exposure (photo-base) as described, for example, in JP-A-5-232706, JP-A-6-11835, JP-A-6-242606, JP-A-6-266100, JP-A-7-333851, JP-A-7-333844, U.S. Pat. No. 5,663,035 and European Patent 677, 788 may be added.

Furthermore, a spectral sensitizer as described below is added to the positive photoresist composition of the present invention to sensitize in a wavelength region longer than a far ultraviolet ray in which the acid-generator used does not have absorption, thereby providing with sensitivity to an i-line or a g-line.

Specific examples of suitable spectral sensitizer include benzophenone, p,p'-tetramethyldiaminobenzophenone, p,p'-tetraethylethylaminobenzophenone, 2-chlorothioxanthone, anthrone, 9-ethoxyanthracene, anthracene, pyrene, perylene, phenothiazine, benzil, Acridine Orange, benzoflavin, Setoflavin-T, 9,10-diphenylanthracene, 9-fluorenone, acetophenone, phenanthrene, 2-nitrofluorene, 5-nitroacenaphthene, benzoquinone, 2-chloro-4-nitroaniline, N-acetyl-p-nitroaniline, p-nitroaniline, N-acetyl-4-nitro-1-naphthylamine, picramide, anthraquinone, 2-ethylanthraquinone, 2-tert-butylanthraquinone, 1,2-benzanthraquinone, 3-methyl-1,3-diaza-1,9-benzanthrone, dibenzalacetone, 1,2-naphthoquinone, 3,3'-carbonyl-bis(5,7-dimethoxycarbonylcoumarin) and coronene. However, the present invention should not be construed as being limited thereto.

The spectral sensitizer may also be used as a light absorbent of far ultraviolet ray from a light source. In this case, the absorbent reduces reflected light from a substrate and decreases the influence of multiple reflection in the resist layer, thereby reducing the standing wave.

The photo-base generator which can be added to the positive photoresist composition of the present invention includes compounds as described, for example, in JP-A-4-151156, JP-A-4-162040, JP-A-5-197148, JP-A-5-5995, JP-A-6-194834, JP-A-8-146608, JP-A-10-83079 and European Patent 622,682. Specific examples of the photo-base generator preferably used include 2-nitrobenzylcarbamate, 2,5-dinitrobenzylcyclohexylcarbamate, N-cyclohexyl-4-methylphenylsulfonamide and 1,1-dimethyl-2-phenylethyl-N-isopropylcarbamate. The photo-base generator is used for the purpose of improving resist profile.

The heat-base generator for use in the positive photoresist composition of the present invention includes compounds as described, for example, in JP-A-5-158242, JP-A-5-158239 and U.S. Pat. No. 5,576,143.

The positive photoresist composition of the present invention is applied to a substrate to form a thin layer. A thickness of the layer coated is preferably from 0.2 to 4.0 μm.

In the present invention, known inorganic or organic anti reflection coating may be used, if desired. Further, an anti reflection coating may be coated on an upper layer of the resist layer.

Suitable examples of the anti reflection coating used for an under layer of the resist layer include an inorganic coating type such as titanium, titanium dioxide, titanium nitride, chromium oxide, carbon and amorphous silicon, and an organic coating type comprising a light absorbent and a polymer material. The former requires equipment such as a vacuum evaporation apparatus, a CVD apparatus and a sputtering apparatus, for the formation of coating. The organic anti reflection coating includes, for example, a coating comprising a condensate of a diphenylamine derivative with a formaldehyde-modified melamine resin, an alkali-soluble resin and a light absorbent as described in JP-B-7-69611 (the term "JP-B" as used herein means an "examined Japanese patent publication"), a coating comprising a reaction product of a maleic anhydride copolymer with a diamine-type light absorbent as described in U.S. Pat. No. 5,294,680, a coating comprising a resin binder and a methylolmelamine-base heat cross-linking agent as described in JP-A-6-118631, an acrylic resin-type anti reflection coating containing a carboxylic acid group, an epoxy group and a light absorbing group within the same molecule as described in JP-A-6-118656, a coating comprising methylolmelamine and a benzophenone-base light absorbent as described in JP-A-8-87115, and a coating obtained by adding a low molecular weight light absorbent to a polyvinyl alcohol resin as described in JP-A-8-179509.

Also, a commercially available organic anti reflection coating, for example, DUV-30 Series and DUV-40 Series (manufactured by Brewer Science, Inc.) and AR-2, AR-3 and AR-5 (manufactured by Shipley Co., Ltd.) are employed as the organic anti reflection coating.

The above-described photoresist solution is coated on a substrate (e.g., silicon/silicon dioxide coating) which may have the above-described anti reflection coating provided thereon, if desired, for use in the production of a precision integrated circuit element by an appropriate coating means such as a spinner or a coater, exposed through a predetermined mask, baked and developed to thereby obtain a good resist pattern.

The exposure light is preferably a ray having a wavelength of from 150 nm to 250 nm. Specific examples thereof include a KrF excimer laser (248 nm), an ArF excimer laser (193 nm), an $F_2$ excimer laser (157 nm), an X ray and an electron beam. Particularly, a device using a KrF excimer laser beam as an exposure light source is preferably employed for the positive photoresist composition of the present invention.

A developing solution which can be used for the photoresist composition according to the present invention is an alkaline aqueous solution of an inorganic alkali such as sodium hydroxide, potassium hydroxide, sodium carbonate, sodium silicate, sodium metasilicate and aqueous ammonia, a primary amine such as ethylamine and n-propylamine, a secondary amine such as diethylamine and di-n-butylamine, a tertiary amine such as triethylamine and methyldiethylamine, an alcohol amine such as dimethylethanolamine and triethanolamine, a quaternary ammonium salt such as tetramethyl ammonium hydroxide, tetraethyl ammonium hydroxide and trimethyl hydroxyethyl ammonium hydroxide, and a cyclic amine such as pyrrole and piperidine.

To the alkaline aqueous solution, an appropriate amount of an alcohol or a surface active agent may be added. Further, a commercially available developing solution containing a surface active agent, for example, HPRD-402 and HPRD-402Z (manufactured by Fuji Film Olin Co., Ltd.) can also be used.

Moreover, an appropriate amount of an anionic surface active agent, a cationic surface active agent or a defoaming agent may be added to the alkaline aqueous solution. These additives are added to the alkaline aqueous solution for the purpose of improving adhesion to a substrate, reducing an amount of the developing solution used and decreasing defect resulting from a bubble during the development, in addition to the purpose of improving the resist characteristics.

The positive photoresist composition of the present invention is suitable for exposure to a far ultraviolet ray, particularly a KrF excimer laser beam, improved in line edge roughness and excellent in sensitivity, resolution, depth of focus and resist profile.

The present invention will be described in greater detail with reference to the following examples, however, the present invention should not be construed as being limited thereto.

Synthesis of Resin

In the synthesis of resin, acetal-formation can be conducted using vinyl ether, or by an acetal exchange method using an alcohol and an alkyl vinyl ether. In order to efficiently and stably synthesize, an azeotropic dehydration method described below is also employed. However, the present invention should not be construed as being limited thereto.

SYNTHESIS EXAMPLE 1

Synthesis of Resin R-1

In 120 ml of butyl acetate was dissolved 32.4 g (0.2 mol) of p-acetoxystyrene. To the solution was then added 0.033 g of azobisisobutylonitrile (AIBN) with stirring in a stream of nitrogen at a temperature of 80° C. every 2.5 hours three times in all. Thereafter, the mixture was stirred for 5 hours to undergo a polymerization reaction. The reaction solution was then poured into 1,200 ml of hexane to cause the precipitation of a white resin. The resin thus obtained was dried, and then dissolved in 150 ml of methanol. To the solution was added a solution of 7.7 g (0.19 mol) of sodium hydroxide in 50 ml of water. The reaction solution was then heated under reflux for 3 hours to undergo hydrolysis. Thereafter, the reaction solution was diluted with 200 ml of water, and then neutralized with hydrochloric acid to cause the precipitation of a white resin. The resin thus obtained was collected by filtration, washed with water, and dried. The resin thus obtained was dissolved in 200 ml of tetrahydrofuran, and added dropwise to 5 liters of ultrapure water with vigorous stirring to reprecipitate. The reprecipitation procedure was then repeated three times. The resin thus obtained was dried at a temperature of 120° C. in a vacuum drier for 12 hours to obtain a poly(p-hydroxystyrene) alkali-soluble resin R-1.

The weight average molecular weight of the resin was 12,000.

SYNTHESIS EXAMPLE 2

Synthesis of Resin R-2

In 100 ml of tetrahydrofuran were dissolved 35.25 g (0.2 mol) of a p-tert-butoxystyrene monomer which had been subjected to dehydration and purification by distillation in an ordinary manner and 5.21 g (0.05 mol) of tert-butylstyrene monomer. To the solution was then added 0.033 g of azobisisobutylonitrile (AIBN) with stirring in a stream of nitrogen at a temperature of 80° C. every 2.5 hours three times in all. Thereafter, the mixture was stirred for 5 hours to undergo a polymerization reaction. The reaction solution was then poured into 1,200 ml of hexane to cause the precipitation of a white resin. The thus obtained was dried, and then dissolved in 150 ml of tetrahydrofuran.

To the solution was added a 4 N hydrochloric acid. The reaction solution was then heated under reflux for 6 hours to undergo hydrolysis. Thereafter, the reaction solution was reprecipitated in 5 liters of ultrapure water. The resin thus obtained was collected by filtration, washed with water, and dried. The resin thus obtained was dissolved in 200 ml of tetrahydrofuran, and added dropwise to 5 liters of ultrapure water with vigorous stirring to reprecipitate. The reprecipitation procedure was then repeated three times. The resin thus obtained was dried at a temperature of 120° C. in a vacuum drier for 12 hours to obtain a copoly(p-hydroxystyrene/tert-butylstyrene) alkali-soluble resin R-2.

The weight average molecular weight of the resin was 12,000.

Resin R-3

Poly (p-hydroxystyrene) (VP8000, manufactured by Nippon Soda Co., Ltd.) was designated as an alkali-soluble resin R-3. The weight average molecular weight of the resin was 9,800.

Resin R-4

Poly (p-hydroxystyrene) (VP15000, manufactured by Nippon Soda Co., Ltd.) was designated as an alkali-soluble resin R-4. The weight average molecular weight of the resin was 17,000.

SYNTHESIS EXAMPLE 3

Synthesis of Alkali-Soluble Resin B-1

In a flask, 20 g of the alkali-soluble resin R-2 obtained in Synthesis Example 2 above and 320 g of propylene glycol monomethyl ether acetate (PGMEA) were dissolved and the solution was subjected to distillation under a reduced pressure to azeotropically distilled off water and PGMEA. After the confirmation of a sufficiently low content of water in the solution, 24 g of ethyl vinyl ether and 0.35 g of p-toluenesulfonic acid were added thereto, followed by stirring at a room temperature for one hour. Then, 0.28 g of triethylamine was added to the reaction mixture to quench the reaction.

To the reaction solution was added ethyl acetate and the mixture was washed with water and then distilled off ethyl acetate, water and the azeotrope portion of PGMEA under a reduced pressure to obtain an alkali-soluble resin B-1 protected with an acid-decomposable group according to the present invention.

SYNTHESIS EXAMPLE 4

Synthesis of Alkali-Soluble Resin B-2

In a flask, 70 g of the alkali-soluble resin R-3 described above and 320 g of propylene glycol monomethyl ether acetate (PGMEA) were dissolved and the solution was subjected to distillation under a reduced pressure to azeotropically distilled off water and PGMEA. After the confirmation of a sufficiently low content of water in the solution, 28 g of benzyl alcohol, 26 g of tert-butyl vinyl ether and 0.35 g of p-toluenesulfonic acid were added thereto, followed by stirring at a room temperature for one hour. Then, 0.1 g of triethylamine was added to the reaction mixture, followed by stirring at a room temperature for 10 minutes to quench the reaction.

To the reaction solution was added ethyl acetate and the mixture was washed with water and then distilled off ethyl acetate, water and the azeotrope portion of PGMEA under a reduced pressure to obtain an alkali-soluble resin B-2 protected with an acid-decomposable group according to the present invention.

SYNTHESIS EXAMPLE 5

Synthesis of Alkali-Soluble Resin B-3

In a flask, 70 g of the alkali-soluble resin R-2 obtained in Synthesis Example 2 above and 320 g of propylene glycol monomethyl ether acetate (PGMEA) were dissolved and the solution was subjected to distillation under a reduced pressure to azeotropically distilled off water and PGMEA. After the confirmation of a sufficiently low content of water in the solution, 20 g of cyclohexyl ethanol, 15.5 g of tert-butyl vinyl ether and 0.35 g of p-toluenesulfonic acid were added thereto, followed by stirring at a room temperature for one hour. Then, 0.28 g of triethylamine was added to the reaction mixture, followed by stirring at a room temperature for 10 minutes to quench the reaction.

To the reaction solution was added ethyl acetate and the mixture was washed with water and then distilled off ethyl acetate, water and the azeotrope portion of PGMEA under a reduced pressure to obtain an alkali-soluble resin B-3 protected with an acid-decomposable group according to the present invention.

SYNTHESIS EXAMPLE 6

Synthesis of Alkali-Soluble Resin B-4

In a flask, 70 g of the alkali-soluble resin R-3 described above and 320 g of propylene glycol monomethyl ether acetate (PGMEA) were dissolved and the solution was subjected to distillation under a reduced pressure to azeotropically distilled off water and PGMEA. After the confirmation of a sufficiently low content of water in the solution, 22 g of cyclohexyl ethanol, 17.5 g of tert-butyl vinyl ether and 0.35 g of p-toluenesulfonic acid were added thereto, followed by stirring at a room temperature for one hour. Then, 0.28 g of triethylamine was added to the reaction mixture, followed by stirring at a room temperature for 10 minutes to quench the reaction.

To the reaction solution was added ethyl acetate and the mixture was washed with water and then distilled off ethyl acetate, water and the azeotrope portion of PGMEA under a reduced pressure to obtain an alkali-soluble resin B-4 protected with an acid-decomposable group according to the present invention.

SYNTHESIS EXAMPLE 7

Synthesis of Alkali-Soluble Resin B-5

In a flask, 20 g of the alkali-soluble resin R-4 described above and 320 g of propylene glycol monomethyl ether acetate (PGMEA) were dissolved and the solution was subjected to distillation under a reduced pressure to azeotropically distilled off water and PGMEA. After the confirmation of a sufficiently low content of water in the solution, 22.4 g of cyclohexyl ethanol, 17.5 g of tert-butyl vinyl ether and 0.35 g of p-toluenesulfonic acid were added thereto, followed by stirring at a room temperature for one hour. Then, 5.5 g of pyridine and thereafter 5.9 g of acetic anhydride were added to the reaction mixture, followed by stirring at a room temperature for one hour.

To the reaction solution was added ethyl acetate and the mixture was washed with water and then distilled off ethyl acetate, water and the azeotrope portion of PGMEA under a reduced pressure to obtain an alkali-soluble resin B-5 protected with an acid-decomposable group according to the present invention.

SYNTHESIS EXAMPLE 8

Synthesis of Alkali-Soluble Resin B-6

In a flask, 20 g of the alkali-soluble resin R-1 obtained in Synthesis Example 1 above and 320 g of propylene glycol monomethyl ether acetate (PGMEA) were dissolved and the solution was subjected to distillation under a reduced pressure to azeotropically distilled off water and PGMEA. After the confirmation of a sufficiently low content of water in the solution, 22.4 g of cyclohexyl ethanol, 17.5 g of tert-butyl vinyl ether and 0.35 g of p-toluenesulfonic acid were added thereto, followed by stirring at a room temperature for one hour. Then, 5.5 g of pyridine and thereafter 5.9 g of acetic anhydride were added to the reaction mixture, followed by stirring at a room temperature for one hour.

To the reaction solution was added ethyl acetate and the mixture was washed with water and then distilled off ethyl acetate, water and the azeotrope portion of PGMEA under a reduced pressure to obtain an alkali-soluble resin B-6 protected with an acid-decomposable group according to the present invention.

EXAMPLES 1 TO 12 AND COMPARATIVE EXAMPLES 1 TO 5

<Preparation and Evaluation of Photosensitive Resin Composition>

EXAMPLE 1

A photosensitive resin composition having the components described below was mixed so as to result in a solid content of about 12% by weight and filtered through a Teflon micro-filter of 0.1 μm to prepare a positive photoresist solution.

Composition:

| Component | Amount (parts by weight) |
|---|---|
| Resin: Resin (B-1) obtained in Synthesis Example 3 | 97.81 |
| Acid-generator: (A-1) shown below | 2.00 |
| Nitrogen-containing Compound of the Present Invention: (C-1) shown below | 0.05 |
| Acid-scavenger: (D-1) shown below | 0.10 |
| Surface Active Agent: (W-2) shown bellow | 0.04 |
| Solvent: (S-1) shown below | 733.33 |

The positive photoresist solution thus-obtained was coated on a silicon wafer of 6 inches having a 60 nm-thick coating of DUV-42 (manufactured by Brewer Science Inc.)

using a spin coater (Mark 8, manufactured by Tokyo Electron Ltd.) and subjected to heat treatment at 120° C. for 90 seconds using a hot plate of vacuum suction type to prepare a resist film having a thickness of about 0.4 μm. The resist film was pattern-exposed with a KrF excimer laser (wavelength: 248 nm, NA=0.63) using a device (FPA-3000EX5, manufactured by Canon Inc.). The exposed resist film was subjected to heat treatment (PEB) at 100° C. for 90 seconds, immediately developed with a 2.38% aqueous tetramethyl ammonium hydroxide solution, rinsed with pure water and spin-dried to prepare a resist pattern.

EXAMPLE 2

A photosensitive resin composition having the components described below was mixed so as to result in a solid content of about 12% by weight and filtered through a Teflon micro-filter of 0.1 μm to prepare a positive photoresist solution. Using the photoresist solution, a resist pattern was prepared in the same manner as in Example 1.

Composition:

| Component | Amount (parts by weight) |
| --- | --- |
| Resin: Resin (B-1) obtained in Synthesis Example 3 | 96.78 |
| Acid-generator: (A-1) shown below | 1.00 |
| Acid-generator: (A-3) shown below | 2.00 |
| Nitrogen-containing Compound of the Present Invention: (C-1) shown below | 0.10 |
| Acid-scavenger: (D-2) shown below | 0.10 |
| Surface Active Agent: (W-2) shown bellow | 0.02 |
| Solvent: (S-1) shown below | 513.33 |
| Solvent: (S-6) shown below | 220.00 |

EXAMPLES 3 TO 12

A photosensitive resin composition having the components described below was mixed so as to result in a solid content of about 12% by weight and filtered through a Teflon micro-filter of 0.1 μm to prepare a positive photoresist solution, and using the photoresist solution, a resist pattern was prepared in the same manner as in Example 1.

| Component | Amount (parts by weight) |
| --- | --- |
| Photosensitive Resin Composition of Example 3: | |
| Resin: Resin (B-1) obtained in Synthesis Example 3 | 95.84 |
| Acid-generator: (A-2) shown below | 1.50 |
| Acid-generator: (A-3) shown below | 1.50 |
| Nitrogen-containing Compound of the Present Invention: (C-4) shown below | 1.00 |
| Acid-scavenger: (D-2) shown below | 0.15 |
| Surface Active Agent: (W-2) shown bellow | 0.01 |
| Solvent: (S-1) shown below | 586.66 |
| Solvent: (S-3) shown below | 146.67 |
| Photosensitive Resin Composition of Example 4: | |
| Resin: Resin (B-1) obtained in Synthesis Example 3 | 88.88 |
| Acid-generator: (A-2) shown below | 1.50 |
| Acid-generator: (A-3) shown below | 4.50 |
| Nitrogen-containing Compound of the Present Invention: (C-7) shown below | 5.00 |
| Acid-scavenger: (D-1) shown below | 0.10 |
| Surface Active Agent: (W-2) shown bellow | 0.02 |
| Solvent: (S-2) shown below | 733.33 |
| Photosensitive Resin Composition of Example 5: | |
| Resin: Resin (B-2) obtained in Synthesis Example 4 | 96.73 |
| Acid-generator: (A-1) shown below | 3.00 |
| Nitrogen-containing Compound of the Present Invention: (C-1) shown below | 0.10 |
| Acid-scavenger: (D-1) shown below | 0.15 |
| Surface Active Agent: (W-1) shown bellow | 0.02 |
| Solvent: (S-1) shown below | 660.00 |
| Solvent: (S-5) shown below | 73.33 |
| Photosensitive Resin Composition of Example 6: | |
| Resin: Resin (B-2) obtained in Synthesis Example 4 | 94.40 |
| Acid-generator: (A-1) shown below | 1.50 |
| Acid-generator: (A-3) shown below | 3.50 |
| Nitrogen-containing Compound of the Present Invention: (C-1) shown below | 0.30 |
| Acid-scavenger: (D-2) shown below | 0.30 |
| Surface Active Agent: (W-2) shown bellow | 0.03 |
| Solvent: (S-1) shown below | 513.33 |
| Solvent: (S-3) shown below | 220.00 |
| Photosensitive Resin Composition of Example 7: | |
| Resin: Resin (B-3) obtained in Synthesis Example 5 | 96.79 |
| Acid-generator: (A-1) shown below | 2.50 |
| Acid-generator: (A-2) shown below | 0.50 |
| Nitrogen-containing Compound of the Present Invention: (C-1) shown below | 0.10 |
| Acid-scavenger: (D-1) shown below | 0.10 |
| Surface Active Agent: (W-2) shown bellow | 0.01 |
| Solvent: (S-1) shown below | 513.33 |
| Solvent: (S-4) shown below | 220.00 |
| Photosensitive Resin Composition of Example 8: | |
| Resin: Resin (B-4) obtained in Synthesis Example 6 | 92.73 |
| Acid-generator: (A-1) shown below | 2.50 |
| Acid-generator: (A-2) shown below | 1.50 |
| Nitrogen-containing Compound of the Present Invention: (C-1) shown below | 0.05 |
| Nitrogen-containing Compound of the Present Invention: (C-8) shown below | 3.00 |
| Acid-scavenger: (D-1) shown below | 0.20 |
| Surface Active Agent: (W-1) shown bellow | 0.02 |
| Solvent: (S-1) shown below | 733.33 |
| Photosensitive Resin Composition of Example 9: | |
| Resin: Resin (B-4) obtained in Synthesis Example 6 | 94.33 |
| Acid-generator: (A-1) shown below | 5.50 |
| Nitrogen-containing Compound of the Present Invention: (C-1) shown below | 0.10 |
| Acid-scavenger: (D-2) shown below | 0.05 |
| Surface Active Agent: (W-2) shown bellow | 0.02 |
| Solvent: (S-1) shown below | 696.66 |
| Solvent: (S-7) shown below | 36.67 |
| Photosensitive Resin Composition of Example 10: | |
| Resin: Resin (B-5) obtained in Synthesis Example 7 | 93.70 |
| Acid-generator: (A-1) shown below | 3.50 |
| Acid-generator: (A-3) shown below | 2.50 |
| Nitrogen-containing Compound of the Present Invention: (C-1) shown below | 0.10 |
| Acid-scavenger: (D-1) shown below | 0.15 |
| Surface Active Agent: (W-1) shown bellow | 0.05 |
| Solvent: (S-1) shown below | 733.33 |

| Component | Amount (parts by weight) |
|---|---|
| Photosensitive Resin Composition of Example 11: | |
| Resin: Resin (B-5) obtained in Synthesis Example 7 | 85.93 |
| Acid-generator: (A-1) shown below | 1.00 |
| Acid-generator: (A-3) shown below | 5.00 |
| Nitrogen-containing Compound of the Present Invention: (C-7) shown below | 8.00 |
| Acid-scavenger: (D-2) shown below | 0.05 |
| Surface Active Agent: (W-2) shown bellow | 0.02 |
| Solvent: (S-1) shown below | 733.33 |
| Photosensitive Resin Composition of Example 12: | |
| Resin: Resin (B-6) obtained in Synthesis Example 8 | 92.07 |
| Acid-generator: (A-1) shown below | 4.00 |
| Acid-generator: (A-3) shown below | 2.50 |
| Nitrogen-containing Compound of the Present Invention: (C-1) shown below | 0.30 |
| Nitrogen-containing Compound of the Present Invention: (C-4) shown below | 1.00 |
| Acid-scavenger: (D-2) shown below | 0.10 |
| Surface Active Agent: (W-1) shown bellow | 0.03 |
| Solvent: (S-1) shown below | 586.66 |
| Solvent: (S-3) shown below | 146.67 |

COMPARATIVE EXAMPLES 1 AND 2

A photosensitive resin composition having the components described below was mixed so as to result in a solid content of about 12% by weight and filtered through a Teflon micro-filter of 0.1 $\mu$m to prepare a positive photoresist solution, and using the photoresist solution, a resist pattern was prepared in the same manner as in Example 1.

| Component | Amount (parts by weight) |
|---|---|
| Photosensitive Resin Composition of Comparative Example 1: | |
| Resin: Resin (B-1) obtained in Synthesis Example 3 | 97.86 |
| Acid-generator: (A-1) shown below | 2.00 |
| Acid-scavenger: (D-1) shown below | 0.10 |
| Surface Active Agent: (W-2) shown bellow | 0.04 |
| Solvent: (S-1) shown below | 733.33 |
| Photosensitive Resin Composition of Comparative Example 2: | |
| Resin: Resin (B-4) obtained in Synthesis Example 6 | 95.78 |
| Acid-generator: (A-1) shown below | 2.50 |
| Acid-generator: (A-2) shown below | 1.50 |
| Acid-scavenger: (D-1) shown below | 0.20 |
| Surface Active Agent: (W-1) shown bellow | 0.02 |
| Solvent: (S-1) shown below | 733.33 |

COMPARATIVE EXAMPLE 3

A photosensitive resin composition having the components described below containing phthalimide described in Example 1 of JP-A-11-44950 as an additive was mixed so as to result in a solid content of about 12% by weight and filtered through a Teflon micro-filter of 0.1 $\mu$m to prepare a positive photoresist solution. Using the photoresist solutions a resist pattern was prepared in the same manner as in Example 1.

| Component | Amount (parts by weight) |
|---|---|
| Photosensitive Resin Composition of Comparative Example 3: | |
| Resin: Resin (B-1) obtained in Synthesis Example 3 | 89.46 |
| Acid-generator: (A-3) shown below | 5.98 |
| Acid-generator: Bis(p-toluenesulfonyl)diazomethane | 2.99 |
| Additive: Phthalimide | 0.40 |
| Acid-scavenger: Tri(n-propyl)amine | 1.00 |
| Surface Active Agent: (W-1) shown bellow | 0.04 |
| Solvent: (S-1) shown below | 733.33 |

COMPARATIVE EXAMPLE 4

A photosensitive resin composition having the components described below containing succinimide described in Example 4 of JP-A-11-44950 as an additive was mixed so as to result in a solid content of about 12% by weight and filtered through a Teflon micro-filter of 0.1 $\mu$m to prepare a positive photoresist solution. Using the photoresist solution, a resist pattern was prepared in the same manner as in Example 1.

| Component | Amount (parts by weight) |
|---|---|
| Photosensitive Resin Composition of Comparative Example 4: | |
| Resin: Resin (B-1) obtained in Synthesis Example 3 | 91.84 |
| Acid-generator: Bis(1,1-dimethylethylsulfonyl)diazomethane | 5.10 |
| Acid-generator: Bis(p-toluenesulfonyl) diazomethane | 2.99 |
| Additive: Succinimide | 0.40 |
| Acid-scavenger: Trioctylamine | 1.00 |
| Surface Active Agent: (W-1) shown bellow | 0.60 |
| Solvent: (S-1) shown below | 733.33 |

COMPARATIVE EXAMPLE 5

A photosensitive resin composition having the components described below containing salicylic acid described in Example 1 of JP-A-9-6001 as an additive was mixed so as to result in a solid content of about 12% by weight and filtered through a Teflon micro-filter of 0.1 $\mu$m to prepare a positive photoresist solution. Using the photoresist solution, a resist pattern was prepared in the same manner as in Example 1.

| Component | Amount (parts by weight) |
|---|---|
| Photosensitive Resin Composition of Comparative Example 5: | |
| Resin: Resin (B-1) obtained in Synthesis Example 3 | 92.39 |
| Acid-generator: (A-3) shown below | 7.00 |
| Additive: Salicylic acid | 0.50 |
| Acid-scavenger: Triethylamine | 0.10 |
| Surface Active Agent: (W-1) shown bellow | 0.01 |
| Solvent: (S-1) shown below | 733.33 |

EXAMPLES 13 TO 24 AND COMPARATIVE EXAMPLES 6 TO 11

EXAMPLE 13

A photosensitive resin composition having the components described below was mixed so as to result in a solid content of about 12% by weight and filtered through a Teflon micro-filter of 0.1 $\mu$m to prepare a positive photoresist solution.

Composition:

| Component | Amount (parts by weight) |
| --- | --- |
| Resin: Resin (B-1) obtained in Synthesis Example 3 | 96.97 |
| Acid-generator: (A-1) shown below | 2.50 |
| Nitrogen-containing Compound of the Present Invention: (I-1) shown below | 0.50 |
| Acid-scavenger: (D-1) shown below | 0.10 |
| Surface Active Agent: (W-2) shown bellow | 0.03 |
| Solvent: (S-1) shown below | 733.33 |

The positive photoresist solution thus-obtained was coated on a silicon wafer of 6 inches having a 60 nm-thick coating of DUV-42 (manufactured by Brewer Science Inc.) using a spin coater (Mark 8, manufactured by Tokyo Electron Ltd.) and subjected to heat treatment at 120° C. for 90 seconds using a hot plate of vacuum suction type to prepare a resist film having a thickness of about 0.4 $\mu$m. The resist film was pattern-exposed with a KrF excimer laser (wavelength: 248 nm, NA=0.63) using a device (FPA-3000EX5, manufactured by Canon Inc.) The exposed resist film was subjected to heat treatment (PEB) at 100° C. for 90 seconds, immediately developed with a 2.38% aqueous tetramethyl ammonium hydroxide solution, rinsed with pure water and spin-dried to prepare a resist pattern.

EXAMPLE 14

A photosensitive resin composition having the components described below was mixed so as to result in a solid content of about 12% by weight and filtered through a Teflon micro-filter of 0.1 $\mu$m to prepare a positive photoresist solution. Using the photoresist solution, a resist pattern was prepared in the same manner as in Example 13.

Composition:

| Component | Amount (parts by weight) |
| --- | --- |
| Resin: Resin (B-1) obtained in Synthesis Example 3 | 92.88 |
| Acid-generator: (A-1) shown below | 1.50 |
| Acid-generator: (A-3) shown below | 2.50 |
| Nitrogen-containing Compound of the Present Invention: (I-1) shown below | 3.00 |
| Acid-scavenger: (D-2) shown below | 0.10 |
| Surface Active Agent: (W-2) shown bellow | 0.02 |
| Solvent: (S-1) shown below | 513.33 |
| Solvent: (S-6) shown below | 220.00 |

EXAMPLES 15 TO 24

A photosensitive resin composition having the components described below was mixed so as to result in a solid content of about 12% by weight and filtered through a Teflon micro-filter of 0.1 $\mu$m to prepare a positive photoresist solution, and using the photoresist solution, a resist pattern was prepared in the same manner as in Example 13.

| Component | Amount (parts by weight) |
| --- | --- |
| Photosensitive Resin Composition of Example 15: | |
| Resin: Resin (B-1) obtained in Synthesis Example 3 | 93.84 |
| Acid-generator: (A-2) shown below | 1.50 |
| Acid-generator: (A-3) shown below | 2.00 |
| Nitrogen-containing Compound of the Present Invention: (I-2) shown below | 2.50 |
| Acid-scavenger: (D-2) shown below | 0.15 |
| Surface Active Agent: (W-2) shown bellow | 0.01 |
| Solvent: (S-1) shown below | 586.66 |
| Solvent: (S-3) shown below | 146.67 |
| Photosensitive Resin Composition of Example 16: | |
| Resin: Resin (B-1) obtained in Synthesis Example 3 | 86.83 |
| Acid-generator: (A-2) shown below | 1.00 |
| Acid-generator: (A-3) shown below | 4.50 |
| Nitrogen-containing Compound of the Present Invention: (I-8) shown below | 7.50 |
| Acid-scavenger: (D-1) shown below | 0.15 |
| Surface Active Agent: (W-2) shown bellow | 0.02 |
| Solvent: (S-2) shown below | 733.33 |
| Photosensitive Resin Composition of Example 17: | |
| Resin: Resin (B-2) obtained in Synthesis Example 4 | 94.28 |
| Acid-generator: (A-1) shown below | 4.00 |
| Nitrogen-containing Compound of the Present Invention: (I-1) shown below | 1.50 |
| Acid-scavenger: (D-1) shown below | 0.20 |
| Surface Active Agent: (W-1) shown bellow | 0.02 |
| Solvent: (S-1) shown below | 660.00 |
| Solvent: (S-5) shown below | 73.33 |
| Photosensitive Resin Composition of Example 18: | |
| Resin: Resin (B-2) obtained in Synthesis Example 4 | 82.23 |
| Acid-generator: (A-1) shown below | 2.50 |
| Acid-generator: (A-3) shown below | 3.00 |
| Nitrogen-containing Compound of the Present Invention: (I-1) shown below | 12.00 |
| Acid-scavenger: (D-1) shown below | 0.25 |
| Surface Active Agent: (W-2) shown bellow | 0.02 |
| Solvent: (S-1) shown below | 513.33 |
| Solvent: (S-4) shown below | 220.00 |
| Photosensitive Resin Composition of Example 19: | |
| Resin: Resin (B-3) obtained in Synthesis Example 5 | 92.29 |
| Acid-generator: (A-1) shown below | 2.50 |
| Acid-generator: (A-2) shown below | 1.50 |
| Nitrogen-containing Compound of the Present Invention: (I-1) shown below | 3.50 |
| Acid-scavenger: (D-1) shown below | 0.20 |
| Surface Active Agent: (W-2) shown bellow | 0.01 |
| Solvent: (S-1) shown below | 513.33 |
| Solvent: (S-4) shown below | 220.00 |
| Photosensitive Resin Composition of Example 20: | |
| Resin: Resin (B-4) obtained in Synthesis Example 6 | 89.23 |
| Acid-generator: (A-1) shown below | 2.50 |
| Acid-generator: (A-2) shown below | 1.50 |
| Nitrogen-containing Compound of the Present Invention: (I-1) shown below | 2.00 |
| Nitrogen-containing Compound of the Present Invention: (I-8) shown below | 4.50 |
| Acid-scavenger: (D-1) shown below | 0.25 |
| Surface Active Agent: (W-1) shown bellow | 0.02 |
| Solvent: (S-1) shown below | 733.33 |

| Component | Amount (parts by weight) |
|---|---|
| Photosensitive Resin Composition of Example 21: | |
| Resin: Resin (B-4) obtained in Synthesis Example 6 | 92.90 |
| Acid-generator: (A-1) shown below | 5.00 |
| Nitrogen-containing Compound of the Present Invention: (I-1) shown below | 2.00 |
| Acid-scavenger: (D-2) shown below | 0.08 |
| Surface Active Agent: (W-2) shown bellow | 0.02 |
| Solvent: (S-1) shown below | 696.66 |
| Solvent: (S-7) shown below | 36.67 |
| Photosensitive Resin Composition of Example 22: | |
| Resin: Resin (B-5) obtained in Synthesis Example 7 | 88.75 |
| Acid-generator (A-1) shown below | 3.50 |
| Acid-generator (A-3) shown below | 2.50 |
| Nitrogen-containing Compound of the Present Invention: (I-1) shown below | 5.00 |
| Acid-scavenger: (D-1) shown below | 0.20 |
| Surface Active Agent: (W-1) shown bellow | 0.05 |
| Solvent: (S-1) shown below | 733.33 |
| Photosensitive Resin Composition of Example 23: | |
| Resin: Resin (B-5) obtained in Synthesis Example 7 | 93.93 |
| Acid-generator: (A-1) shown below | 1.00 |
| Acid-generator: (A-3) shown below | 5.00 |
| Nitrogen-containing Compound of the Present Invention: (I-10) shown below | 10.00 |
| Acid-scavenger: (D-2) shown below | 0.05 |
| Surface Active Agent: (W-2) shown bellow | 0.02 |
| Solvent: (S-1) shown below | 733.33 |
| Photosensitive Resin Composition of Example 24: | |
| Resin: Resin (B-6) obtained in Synthesis Example 8 | 86.82 |
| Acid-generator: (A-1) shown below | 3.00 |
| Acid-generator: (A-3) shown below | 3.00 |
| Nitrogen-containing Compound of the Present Invention: (I-1) shown below | 4.00 |
| Nitrogen-containing Compound of the Present Invention: (I-8) shown below | 3.00 |
| Acid-scavenger: (D-2) shown below | 0.15 |
| Surface Active Agent: (W-1) shown bellow | 0.03 |
| Solvent: (S-1) shown below | 586.66 |
| Solvent: (S-3) shown below | 146.67 |

COMPARATIVE EXAMPLES 6 AND 7

A photosensitive resin composition having the components described below was mixed so as to result in a solid content of about 12% by weight and filtered through a Teflon micro-filter of 0.1 μm to prepare a positive photoresist solution, and using the photoresist solution, a resist pattern was prepared in the same manner as in Example 13.

| Component | Amount (parts by weight) |
|---|---|
| Photosensitive Resin Composition of Comparative Example 6: | |
| Resin: Resin (B-1) obtained in Synthesis Example 3 | 97.86 |
| Acid-generator: (A-1) shown below | 2.00 |
| Acid-scavenger: (D-1) shown below | 0.10 |
| Surface Active Agent: (W-2) shown bellow | 0.04 |
| Solvent: (S-1) shown below | 733.33 |
| Photosensitive Resin Composition of Comparative Example 7: | |
| Resin: Resin (B-4) obtained in Synthesis Example 6 | 98.28 |
| Acid-generator: (A-2) shown below | 1.50 |
| Acid-scavenger: (D-1) shown below | 0.20 |
| Surface Active Agent: (W-1) shown bellow | 0.02 |
| Solvent: (S-1) shown below | 733.33 |

COMPARATIVE EXAMPLE 8

A photosensitive resin composition having the components described below containing acetanilide described in Example of JP-A-63-14963 as an additive was mixed so as to result in a solid content of about 12% by weight and filtered through a Teflon micro-filter of 0.1 μm to prepare a positive photoresist solution, and using the photoresist solution, a resist pattern was prepared in the same manner as in Example 13.

| Component | Amount (parts by weight) |
|---|---|
| Photosensitive Resin Composition of Comparative Example 8: | |
| Resin: Resin (B-1) obtained in Synthesis Example 3 | 91.76 |
| Acid-generator: (A-1) shown below | 3.00 |
| Additive: Acetanilide | 5.00 |
| Acid-scavenger: (D-1) shown below | 0.20 |
| Surface Active Agent: (W-1) shown bellow | 0.04 |
| Solvent: (S-1) shown below | 733.33 |

COMPARATIVE EXAMPLE 9

A photosensitive resin composition having the components described below containing p-aminobenxoic acid described in JP-A-63-149640 as an additive was mixed so as to result in a solid content of about 12% by weight and filtered through a Teflon micro-filter of 0.1 μm to prepare a positive photoresist solution, and using the photoresist solution, a resist pattern was prepared in the same manner as in Example 13.

| Component | Amount (parts by weight) |
|---|---|
| Photosensitive Resin Composition of Comparative Example 9: | |
| Resin: Resin (B-1) obtained in Synthesis Example 3 | 94.78 |
| Acid-generator: (A-1) shown below | 2.00 |
| Additive: p-Aminobenzoic acid | 3.00 |
| Acid-scavenger: (D-1) shown below | 0.20 |
| Surface Active Agent: (W-2) shown bellow | 0.02 |
| Solvent: (S-1) shown below | 733.33 |

COMPARATIVE EXAMPLE 10

A photosensitive resin composition having the components described below containing nicotinicamide described in Example of JP-A-5-249683 as an additive was mixed so as to result in a solid content of about 12% by weight and filtered through a Teflon micro-filter of 0.1 μm to prepare a positive photoresist solution, and using the photoresist solution, a resist pattern was prepared in the same manner as in Example 13.

Photosensitive Resin Composition of Comparative Example 10:

| Component | Amount (parts by weight) |
|---|---|
| Resin: Resin (B-1) obtained in Synthesis Example 3 | 91.78 |
| Acid-generator: (A-3) shown below | 3.00 |
| Additive: Nicotinicamide | 5.00 |
| Acid-scavenger: (D-1) shown below | 0.20 |
| Surface Active Agent: (W-1) shown bellow | 0.02 |
| Solvent: (S-1) shown below | 733.33 |

COMPARATIVE EXAMPLE 11

A photosensitive resin composition having the components described below containing phthalimide described in Example of JP-A-11-44950 as an additive was mixed so as to result in a solid content of about 12% by weight and filtered through a Teflon micro-filter of 0.1 μm to prepare a positive photoresist solution, and using the photoresist solution, a resist pattern was prepared in the same manner as in Example 13.

Photosensitive Resin Composition of Comparative Example 11:

| Component | Amount (parts by weight) |
|---|---|
| Resin: Resin (B-1) obtained in Synthesis Example 3 | 92.78 |
| Acid-generator: (A-1) shown below | 1.00 |
| Acid-generator: (A-3) shown below | 3.00 |
| Additive: Phthalimide | 3.00 |
| Acid-scavenger: (D-1) shown below | 0.20 |
| Surface Active Agent: (W-1) shown bellow | 0.02 |
| Solvent: (S-1) shown below | 733.33 |

The nitrogen-containing compound of the present invention used are shown below.
Nitrogen-containing Compound (C-1):
   N-Benzoyl-N-phenylhydroxylamine
Nitrogen-containing Compound (C-4):
   N-Hydroxyphtalimide
Nitrogen-containing Compound (C-7):
   3,4-Dihydro-3-hydroxy-4-oxo-1,2,3-benzotriazole
Nitrogen-containing Compound (C-8):
Salicylhydroxamic acid
   Nitrogen-containing Compound (I-1):
      Commercially available reagent from Aldrich Co., Ltd. was used as it was.
Nitrogen-containing Compound (I-2):
   Commercially available reagent from Tokyo Kasei Co., Ltd. was used as it was.
Nitrogen-containing Compound (I-8):
   It was synthesized according to the method described in J. Med. Chem., 30 (3), 574(1987)
Nitrogen-containing Compound (I-10):
   It was synthesized according to the method described in J. Org. Chem., 60(24), 8084(1995).

Acid-generators (A-1) to (A-3) and Acid-scavengers(D-1) to (D-2) used are shown below.

-continued

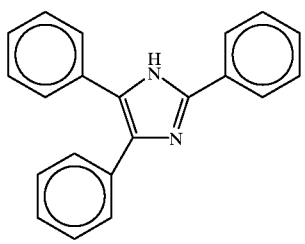
(D-2)

Surface active agents (W-1) and (W-2) used are shown below.
Surface Active Agent (W-1):
  Megafac R08 (manufactured by Dainippon Ink and Chemicals, Inc.)
Surface Active Agent (W-2):
  Troysol S-366 (manufactured by Troy Chemical Co., Ltd.)
Solvents (S-1) to (S-7) used are shown below.
Solvent (S-1):
  Propylene glycol monomethyl ether acetate
Solvent (S-2):
  Propylene glycol monomethyl ether propionate
Solvent (S-3):
  Propylene glycol monomethyl ether
Solvent (S-4):
  Ethoxyethyl propionate
Solvent (S-5):
  γ-Butyrolactone
Solvent (S-6):
  Ethyl lactate
Solvent (S-7):
  Propylene carbonate With the resist pattern obtained, sensitivity, resolution, depth of focus, line edge roughness and profile were evaluated in the following manner.

<Sensitivity>

The sensitivity was evaluated by measuring the minimum exposure amount necessary for reproducing a line pattern of 0.16 μm in a mask.

<Resolution>

The resolution is represented by a width (μm) of line pattern which can be resolved, i.e., a limiting resolution at the minimum exposure amount necessary for reproducing a line pattern of 0.16 μm in a mask.

<Depth of Focus>

A range of focus capable of reproducing a line pattern of 0.16 μm was determined, when the resist film was exposed with the minimum exposure amount necessary for reproducing a line pattern of 0.16 μm in a mask while moving the focus position up and down, then subjected to the heat treatment (PEB) and development.

<Line Edge Roughness>

A distance from the standard line where the edge should be present to the edge of the line pattern of 0.16 μm in width obtained by the minimum exposure amount necessary for reproducing a line pattern of 0.16 μm in a mask was measured in 50 points in the area of a length of 5 μm of the line pattern using a device (S-8840, manufactured by Hitachi, Ltd.), standard deviation was determined and 3 σ was calculated. The smaller the value, the better the quality.

<Profile>

A cross-section of the line pattern of 0.16 μm in width obtained by the minimum exposure amount necessary for reproducing a line pattern of 0.16 μm in a mask was observed using a scanning electron microscope. The pattern having rectangular profile is indicated by A and the pattern having tapered profile is indicated by C. The pattern having somewhat tapered profile is indicated by B.

The results thus-obtained are shown in Tables 1 and 2 below.

TABLE 1

| Example | Sensitivity (mJ/cm$^2$) | Resolution (μm) | Depth of Focus (μm) | Line Edge Roughness (angstrom) | Profile |
|---|---|---|---|---|---|
| 1 | 26 | 0.15 | 0.90 | 40 | A |
| 2 | 27 | 0.15 | 0.90 | 45 | A |
| 3 | 31 | 0.15 | 0.90 | 50 | A |
| 4 | 30 | 0.15 | 0.90 | 55 | A |
| 5 | 25 | 0.14 | 1.05 | 40 | A |
| 6 | 18 | 0.13 | 1.20 | 30 | A |
| 7 | 29 | 0.14 | 1.05 | 35 | A |
| 8 | 24 | 0.14 | 1.05 | 30 | A |
| 9 | 29 | 0.14 | 1.05 | 35 | A |
| 10 | 27 | 0.14 | 1.05 | 35 | A |
| 11 | 24 | 0.14 | 1.05 | 55 | A |
| 12 | 16 | 0.14 | 1.05 | 30 | A |
| Comparative Example | | | | | |
| 1 | 37 | 0.15 | 0.90 | 100 | A |
| 2 | 35 | 0.15 | 1.05 | 80 | A |
| 3 | 78 | 0.15 | 0.75 | 90 | B |
| 4 | 69 | 0.15 | 0.90 | 75 | B |
| 5 | 52 | 0.15 | 0.90 | 80 | B |

TABLE 2

| Example | Sensitivity (mJ/cm$^2$) | Resolution (μm) | Depth of Focus (μm) | Line Edge Roughness (angstrom) | Profile |
|---|---|---|---|---|---|
| 13 | 22 | 0.14 | 0.90 | 40 | A |
| 14 | 25 | 0.14 | 1.05 | 35 | A |
| 15 | 23 | 0.13 | 1.05 | 35 | A |
| 16 | 22 | 0.14 | 1.20 | 30 | A |
| 17 | 23 | 0.14 | 1.05 | 40 | A |
| 18 | 25 | 0.14 | 1.05 | 35 | A |
| 19 | 27 | 0.13 | 1.05 | 30 | A |
| 20 | 21 | 0.13 | 1.05 | 30 | A |
| 21 | 27 | 0.13 | 1.20 | 30 | A |
| 22 | 33 | 0.14 | 1.05 | 30 | A |
| 23 | 24 | 0.14 | 1.05 | 30 | A |
| 24 | 26 | 0.13 | 1.20 | 30 | A |
| Comparative Example | | | | | |
| 6 | 37 | 0.15 | 0.90 | 100 | A |
| 7 | 35 | 0.15 | 1.05 | 80 | A |
| 8 | 64 | 0.15 | 0.90 | 80 | B |
| 9 | 66 | 0.15 | 0.90 | 90 | B |
| 10 | 51 | 0.15 | 0.90 | 80 | B |
| 11 | 52 | 0.15 | 0.75 | 70 | B |

As is apparent from the results shown in Tables 1 and 2 above, the resist compositions of the present invention exhibit the satisfactory results in any of the sensitivity, resolution depth of focus, line edge roughness and profile. Particularly, the remarkably good results on the line edge roughness are obtained.

While the invention has been described in detail and with reference to specific examples thereof, it will be apparent to one skilled in the art that various changes and modifications can be made therein without departing from the spirit and scope thereof.

This application is based on Japanese patent applications No. 2000-26363 filed on Feb. 3, 2000 and No. 2000-196719 filed on Jun. 29, 2000, the entire contents of which incorporated herein by reference.

What is claimed is:

1. A positive photoresist composition which comprises (A) a compound which generates an acid upon irradiation with an actinic ray or radiation, (B) a resin which is insoluble or sparingly soluble in alkali but becomes soluble in alkali by the action of an acid, and (C) a nitrogen-containing compound containing at least one partial structure represented by formula (I) shown below in its molecule:

2. The positive photoresist composition as claimed in claim 1, wherein the nitrogen-containing compound of (C) is a compound represented by formula (Ia) shown below:

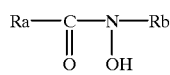

wherein Ra represents a hydrogen atom, an alkyl group which may be substituted, an alkenyl group which may be substituted or an aryl group which may be substituted; Rb represents a hydrogen atom, an aryl group which maybe substituted, —C(=O)—Ra or —N=N—Ra; or Ra and Rb may be connected with each other to form a ring.

3. The positive photoresist composition as claimed in claim 1, wherein the nitrogen-containing compound of (C) is a compound represented by formula (II-1) shown below:

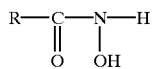

wherein R represents a monovalent organic residue having from 1 to 20 carbon atoms.

4. The positive photoresist composition as claimed in claim 1, wherein the nitrogen-containing compound of (C) is a compound represented by formula (II-2) shown below:

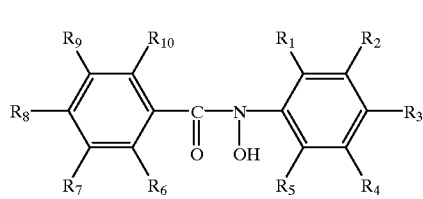

wherein $R_1$ to $R_{10}$, which may be the same or different, each represents a hydrogen atom, a hydroxy group, a halogen atom, a nitro group, a cyano group, an alkyl group, an alkoxy group, a hydroxyalkyl group, a cycloalkyl group or an aryl group.

5. The positive photoresist composition as claimed in claim 1, wherein the resin of (B) contains a repeating unit represented by formula (IV) shown below and a repeating unit represented by formula (V) shown below:

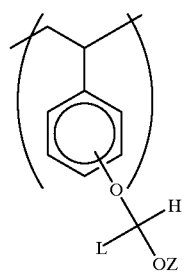

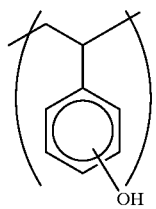

wherein L represents a hydrogen atom, a straight-chain, branched chain or cyclic alkyl group which maybe substituted or an aralkyl group which may be substituted; Z represents a straight-chain, branched chain or cyclic alkyl group which may be substituted or an aralkyl group which may be substituted; or Z and L may be combined with each other to form a 5-membered or 6-membered ring.

6. The positive photoresist composition as claimed in claim 1, wherein the composition further comprises (D) a nitrogen-containing basic compound as an acid-scavenger.

7. The positive photoresist composition as claimed in claim 1, wherein the compound which generates an acid upon irradiation with an actinic ray or radiation of (A) is that selected from diazonium salts, ammonium salts, phosphonium salts, iodonium salts, sulfonium salts, selenonium salts, arsonium salts, organic halide compounds, organic metal/organic halide compounds, photo-acid generators having an o-nitrobenzyl type protective group, compounds which photolyze to generate a sulfonic acid, disulfone compounds, diazoketosulfone compounds and diazodisulfone compounds.

8. The positive photoresist composition as claimed in claim 1, wherein the compound which generates an acid upon irradiation with an actinic ray or radiation of (A) is an oxazole derivative substituted with a trihalomethyl group represented by formula (PAG1) shown below or an s-triazine derivative substituted with a trihalomethyl group represented by formula (PAG2) shown below:

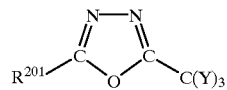

-continued (PAG2)

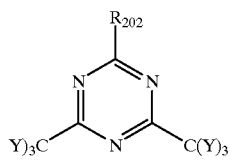

wherein R²⁰¹ represents a substituted or unsubstituted aryl group or a substituted or unsubstituted alkenyl group; R²⁰² represents a substituted or unsubstituted aryl group, a substituted or unsubstituted alkenyl group, a substituted or unsubstituted alkyl group or —C(Y)₃; and Y represents a chlorine atom or a bromine atom.

9. The positive photoresist composition as claimed in claim 1, wherein the compound which generates an acid upon irradiation with an actinic ray or radiation of (A) is an iodonium salt represented by formula (PAG3) shown below or a sulfonium salt represented by formula (PAG4) shown below:

(PAG3)

(PAG4)

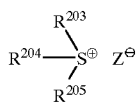

wherein Ar¹ and Ar², which may be the same or different, each represents a substituted or unsubstituted aryl group; R²⁰³, R²⁰⁴ and R²⁰⁵, which may be the same or different, each represents a substituted or unsubstituted alkyl group or a substituted or unsubstituted aryl group; and Z⁻ represents a counter anion.

10. The positive photoresist composition as claimed in claim 1, wherein the compound which generates an acid upon irradiation with anactinic ray or radiation of (A) is a disulfone derivative represented by formula (PAG5) shown below or an iminosulfonate derivative represented by formula (PAG6) shown below:

(PAG5)

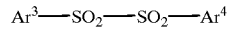

(PAG6)

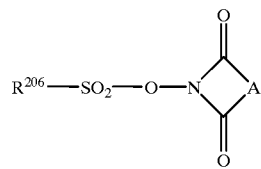

wherein Ar³ and Ar⁴, which may be the same or different, each represents a substituted or unsubstituted aryl group; R²⁰⁶ represents a substituted or unsubstituted alkyl group or a substituted or unsubstituted aryl group; and A represents a substituted or unsubstituted alkylene group, a substituted or unsubstituted alkenylene group or a substituted or unsubstituted arylene group.

11. The positive photoresist composition as claimed in claim 1, wherein the compound which generates an acid upon irradiation with an actinic ray or radiation of (A) is a diazodisulfone derivative represented by formula (PAG7) shown below:

(PAG7)

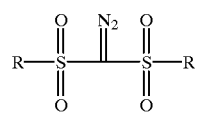

wherein R represents a straight-chain, branched chain or cyclic alkyl group or an aryl group which may be substituted.

12. The positive photoresist composition as claimed in claim 1, wherein the resin of (B) has an acid-decomposable group in the polymer main chain or side chain, or both the polymer main chain and side chain.

13. The positive photoresist composition as claimed in claim 12, wherein the acid-decomposable group is a group represented by formula —COOA⁰ or a group represented by formula —O—B⁰ wherein A⁰ represents —C(R⁰¹)(R⁰²)(R⁰³), —Si(R⁰¹)(R⁰²)(R⁰³) or —C(R⁰⁴)(R⁰⁵)—O—(R⁰⁶); B⁰ represents —A⁰ or —COO—A⁰; R⁰¹, R⁰², R⁰³, R⁰⁴ and R⁰⁵, which maybe the same or different, each represents a hydrogen atom, an alkyl group, a cycloalkyl group, an alkenyl group or an aryl group; and R⁰⁶ represents an alkyl group or an aryl group, provided that at least two of R⁰¹ to R⁰³ are not hydrogen atoms; or two of R⁰¹ to R⁰³ are bonded to each other to form a ring or two of R⁰⁴ to R⁰⁶ are bonded to each other to form a ring.

14. The positive photoresist composition as claimed in claim 1, wherein the resin of (B) is that whose 1 μm-thick film has transmittance at 248 nm of from 20% to 90%.

15. The positive photoresist composition as claimed in claim 5, wherein a molar ratio of the repeating unit represented by formula (IV)/the repeating unit represented by formula (V) present in the resin is from 1/99 to 60/40.

16. The positive photoresist composition as claimed in claim 1, wherein the resin of (B) has a weight average molecular weight of from 2,000 to 300,000.

17. The positive photoresist composition as claimed in claim 1, wherein the resin of (B) has a molecular weight distribution of from 1.0 to 5.0.

18. The positive photoresist composition as claimed in claim 6, wherein the nitrogen-containing basic compound of (D) is that having the structure represented by the following formula (A), (B), (C), (D) or (E):

(A)

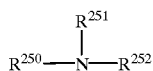

wherein R²⁵⁰, R²⁵¹ and R²⁵², which may be the same or different, each represents a hydrogen atom, an alkyl group having from 1 to 6 carbon atoms, an aminoalkyl group having from 1 to 6 carbon atoms, a hydroxyalkyl group having from 1 to 6 carbon atoms or a substituted or unsubstituted aryl group having from 6 to 20 carbons atoms, or R²⁵¹ and R²⁵² may be combined with each other to form a ring;

(B)

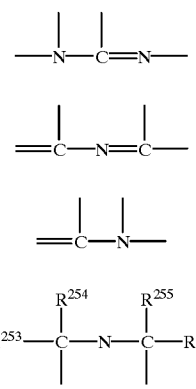

(C)

(D)

(E)

wherein $R^{253}$, $R^{254}$, $R^{255}$ and $R^{256}$, which maybe the same or different, each represents an alkyl group having from 1 to 6 carbon atoms.

19. The positive photoresist composition as claimed in claim 6, wherein the nitrogen-containing basic compound of (D) is represented by the following formula (VI):

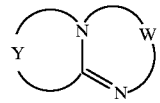

(VI)

wherein Y and W, which may be the same or different, each represents a straight-chain, branched chain or cyclic alkylene group which may contain a hetero atom or may be substituted.

20. The positive photoresist composition as claimed in claim 1, wherein the composition further comprises a fluorine-base and/or silicon-base surface active agent.

* * * * *